US012622208B2

(12) United States Patent
Jayaraman et al.

(10) Patent No.: US 12,622,208 B2
(45) Date of Patent: May 5, 2026

(54) DROPLET JET NOZZLE DESIGN

(71) Applicant: Applied Materials, Inc., Santa Clara, CA (US)

(72) Inventors: Manikandan Jayaraman, Santa Clara, CA (US); Jagadeesh Kumar Sukumaran, Santa Clara, CA (US); Jagan Rangarajan, San Jose, CA (US); Ekaterina A. Mikhaylichenko, San Jose, CA (US); Yunshuang Ding, Santa Clara, CA (US); Yuwen Huang, Santa Clara, CA (US); Timothy Thao, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 103 days.

(21) Appl. No.: 18/608,032

(22) Filed: Mar. 18, 2024

(65) Prior Publication Data

US 2024/0395579 A1     Nov. 28, 2024

Related U.S. Application Data

(63) Continuation-in-part of application No. 18/322,484, filed on May 23, 2023.

(51) Int. Cl.
*H01L 21/67* (2006.01)
(52) U.S. Cl.
CPC .... *H01L 21/6715* (2013.01); *H01L 21/67051* (2013.01); *H01L 21/67219* (2013.01)
(58) Field of Classification Search
CPC .......... H01L 21/6715; H01L 21/67051; H01L 21/67219
See application file for complete search history.

(56) References Cited

U.S. PATENT DOCUMENTS 5,284,519 A * 2/1994 Gadgil .................. C23C 16/455
                                                118/728
5,516,046 A * 5/1996 Cline ................... B05B 7/0416
                                                239/548

(Continued)

FOREIGN PATENT DOCUMENTS

KR        20180082745 A      7/2018

OTHER PUBLICATIONS

Machine Translation of KR 2018008274r to Yoon, Jul. 2018. (Year: 2018).*

(Continued)

*Primary Examiner* — Benjamin L Osterhout
(74) *Attorney, Agent, or Firm* — Patterson + Sheridan, LLP

(57)          ABSTRACT

In one embodiment, a nozzle assembly includes a body with an internal surface forming an internal cavity within the body. The assembly also includes a gas inlet disposed within the body, a fluid inlet disposed within the body and a mixing chamber disposed within the internal cavity of the body, such that an annular gap is formed between the internal surface and an exterior surface of the mixing chamber, the mixing chamber may include: a mixing body region within the mixing chamber; one or more gas ports fluidly connecting the gas inlet to the mixing chamber, the gas ports tangentially aligned with an interior surface of the mixing chamber; a fluid port in fluid communication with the fluid inlet of the body and the mixing body region of the mixing chamber; and an outlet in fluid communication with the mixing body region configured to deliver a fluid mixture.

20 Claims, 15 Drawing Sheets

(56) References Cited

U.S. PATENT DOCUMENTS

| | | | |
|---|---|---|---|
| 5,885,358 A | 3/1999 | Maydan et al. | |
| 2001/0042508 A1 | 11/2001 | Kay et al. | |
| 2002/0035762 A1* | 3/2002 | Okuda .............. | H01L 21/67046 |
| | | | 134/102.1 |
| 2004/0261817 A1* | 12/2004 | Araki ................ | H01L 21/67051 |
| | | | 134/102.1 |
| 2005/0115671 A1* | 6/2005 | Araki ................ | H01L 21/31116 |
| | | | 257/E21.228 |
| 2013/0142700 A1* | 6/2013 | Parimi ................ | B01J 19/2485 |
| | | | 222/129 |
| 2015/0144164 A1* | 5/2015 | Ishibashi .......... | H01L 21/67051 |
| | | | 134/102.1 |
| 2019/0035649 A1 | 1/2019 | Shibayama et al. | |
| 2019/0057882 A1 | 2/2019 | Kim et al. | |
| 2020/0290068 A1 | 9/2020 | Langner et al. | |

OTHER PUBLICATIONS

International Search Report and Written Opinion dated June 27, 2024; re PCT/US2024/02509.

* cited by examiner

300

313

305

315

303

305b

313

311

305a

301

309

309

307

319

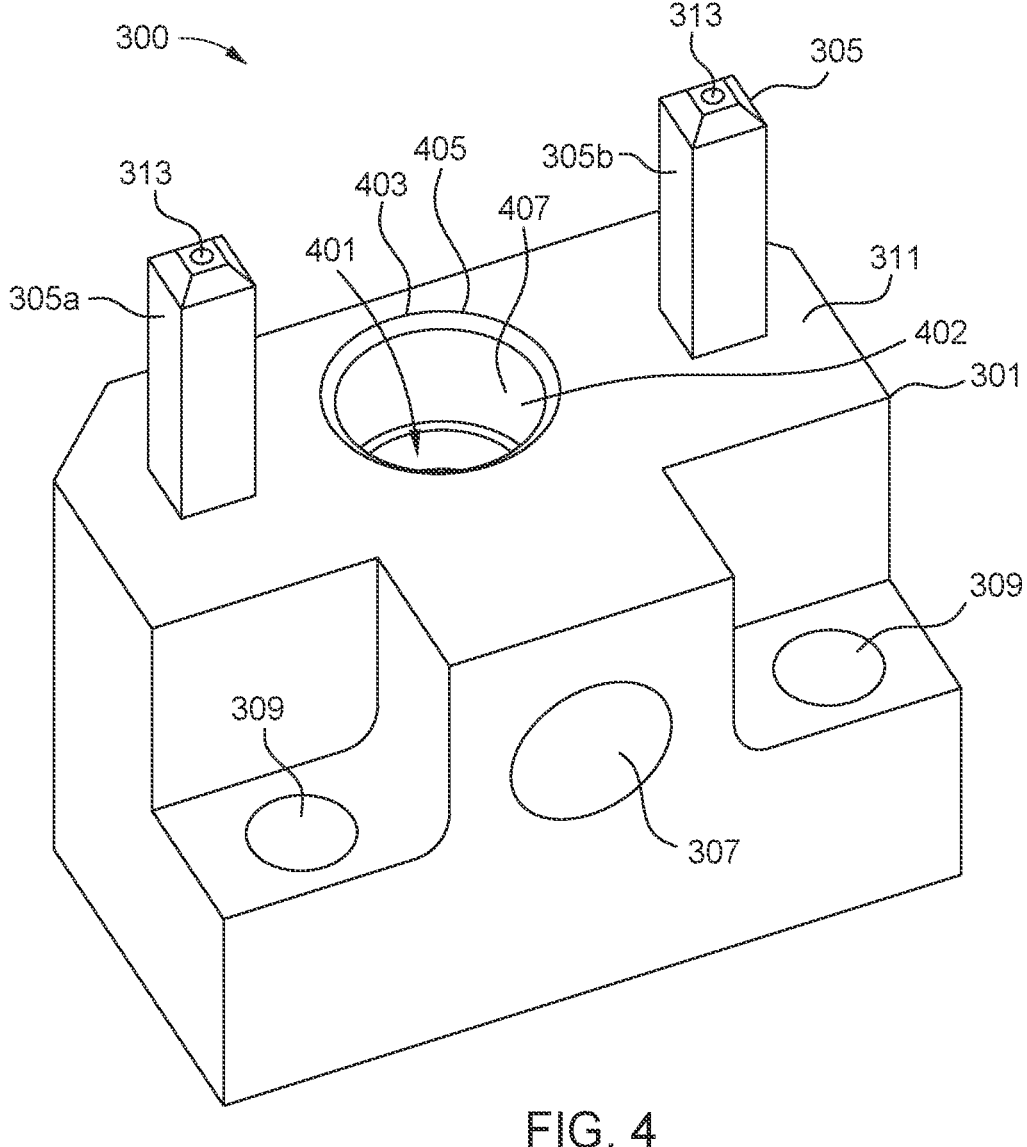
FIG. 4
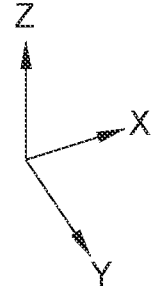

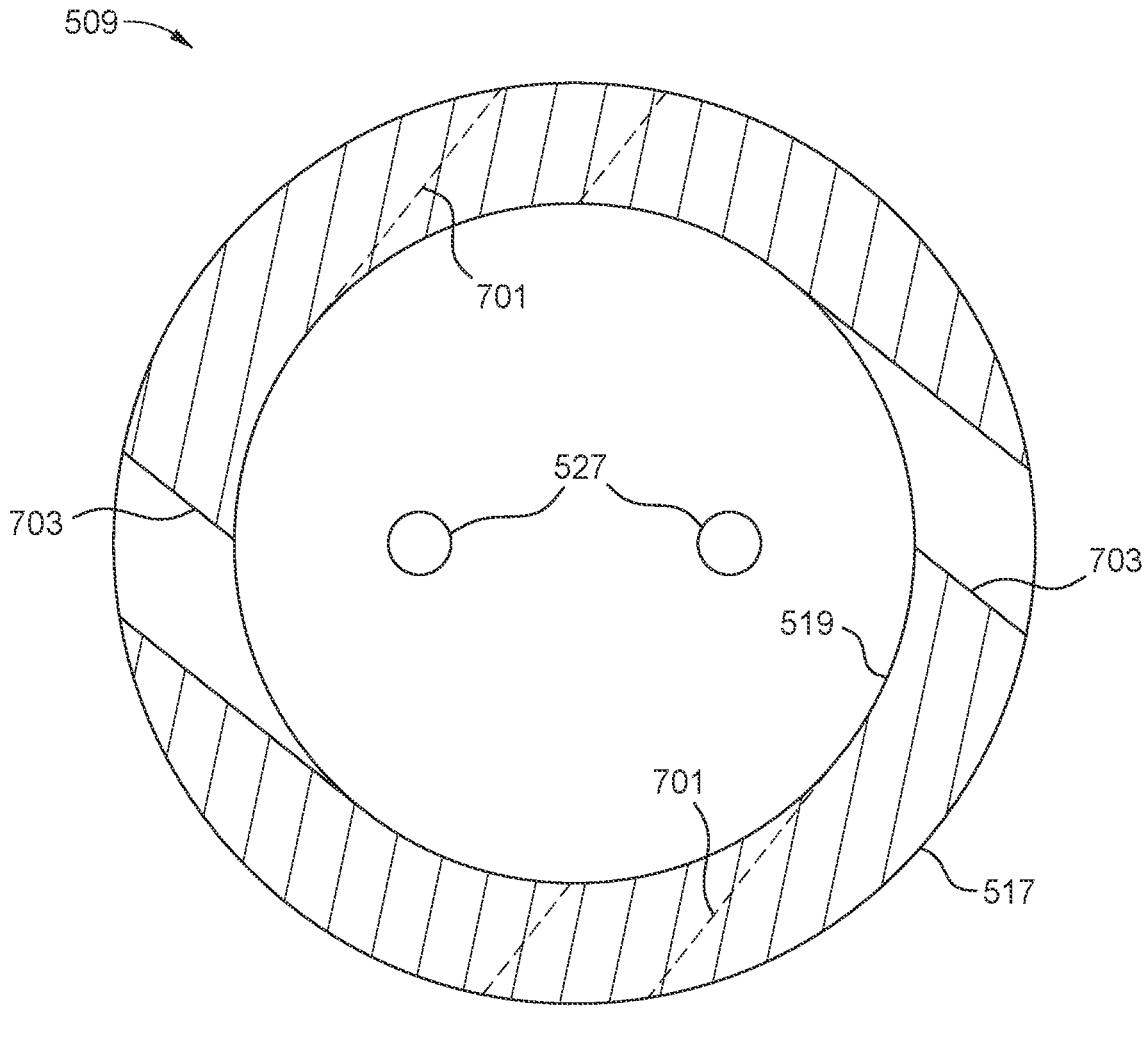
FIG. 7B
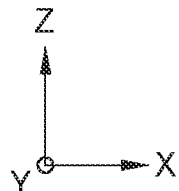

DROPLET JET NOZZLE DESIGN

CROSS-REFERENCE TO RELATED APPLICATIONS

This application is a Continuation-in-Part application of U.S. patent application Ser. No. 18/322,484, filed May 23, 2023, which is incorporated by reference in its entirety herein.

BACKGROUND

Field

Embodiments of the present disclosure generally relate to apparatus for cleaning substrates, and, more particularly, to nozzle assemblies which may be used to clean the surface of a substrate.

Description of the Related Art

Substrate processing units may perform chemical mechanical polishing (CMP), which is commonly used in the manufacturing of high-density integrated circuits to planarize or polish a layer of material deposited on a substrate. In a typical CMP process, a substrate is retained in a carrier head that presses the backside of the substrate towards a rotating polishing pad in the presence of a polishing fluid. Material is removed across the material layer surface of the substrate in contact with the polishing pad through a combination of chemical and mechanical activity which is provided by the polishing fluid and a relative motion of the substrate and the polishing pad. Typically, after one or more CMP processes are completed, a polished substrate is further processed by use of one or more post-CMP substrate processing operations in a CMP processing system. For example, the polished substrate may be further processed using one or more cleaning operations in a cleaning unit. Various cleaning operations may be performed in a cleaning unit having multiple cleaning stations, i.e., cleaning modules. Once the post-CMP operations are complete, the substrate can be removed from a CMP processing system and then delivered to the next device manufacturing system, such as a lithography, etch, or deposition system.

Typically, a substrate enters a cleaning unit of a CMP tool from a polisher and is inserted into and acted upon by one or more cleaning modules. A nozzle will typically flow a fluid, such as deionized (DI) water, a cleaning chemical, a gas, or combination thereof onto the substrate in a cleaning or a rinse operation. The water flowing onto the substrate can splash and create a spray that then splashes back onto the surface of the substrate. The splash back of the spray onto the substrate can bead up, especially on hydrophobic surfaces. During a later drying phase, the water can evaporate to leave a watermark. Watermarks can be the result of an outline of the water bead that can contain a redeposit of the particles that were intended to be removed by the rinse operation. Alternatively, these watermarks can be the result of hydrolysis of the DI water, producing small amounts of hydroxide ion, which, in the presence of oxygen, allow the silicon substrate to oxidize, creating an oxide deposit upon final drying. Additionally, the nozzles can have leaks within the various components, causing inconsistencies in the sprayed cleaning mixtures.

Accordingly, an improved nozzle is needed for use in the cleaning module.

SUMMARY

Embodiments herein include nozzles for cleaning substrates in semi-conductor manufacturing operations. In one embodiment, a nozzle assembly is provided. The nozzle assembly includes a body having an internal surface forming an internal cavity within the body. The assembly also includes a gas inlet disposed within the body. The assembly also includes a fluid inlet disposed within the body. The assembly also includes a mixing chamber disposed within the internal cavity of the body, such that an annular gap is formed between the internal surface of the internal cavity and an exterior surface of the mixing chamber, the mixing chamber may include: a mixing body region disposed within the mixing chamber; one or more gas ports fluidly connecting the gas inlet to the mixing chamber, the gas ports tangentially aligned with an interior surface of the mixing chamber; a fluid port in fluid communication with the fluid inlet of the body and the mixing body region of the mixing chamber; and an outlet in fluid communication with the mixing body region configured to deliver a fluid mixture to a region outside of the nozzle assembly.

In another embodiment, a nozzle assembly is provided. The nozzle assembly includes a body having an internal surface forming an internal cavity within the body. The assembly also includes a gas inlet disposed within the body. The assembly also includes a fluid inlet disposed within the body. The assembly also includes a nozzle shroud disposed within an internal cavity of the body, such that an annular gap is formed between the nozzle shroud and an internal surface of the internal cavity, the nozzle shroud may include: an outlet channel may include an outlet; one or more radial gas ports disposed at an angle to a central axis, through a shroud body, the one or more radial gas ports in fluid communication with a mixing region and the outlet; and an internal nozzle shroud face adjacent the mixing region. The assembly also includes a fluid accelerator disposed within the nozzle shroud, opposite the outlet channel, the fluid accelerator may include: a fluid cavity disposed through the fluid accelerator; and a fluid stem, the fluid stem fluidly connecting the fluid cavity to the mixing region.

In yet another embodiment, a nozzle assembly is provided. The nozzle assembly includes a gas inlet disposed within a body. The assembly includes a fluid inlet disposed within the body. The assembly also includes an internal cavity formed within the body and in fluid communication with the gas inlet and the fluid inlet. The assembly also includes a cap, the cap configured to enable sealing of one or more spaces disposed within the body, the cap may include: a threaded region configured to screw into the body, and a cap seal configured to provide a fluid seal between the cap and the body. The assembly also includes one or more rinse ports disposed within the body. The assembly also includes one or more rinse nozzles, each of the one or more rinse nozzles disposed on the body and fluidly connected to a corresponding one of the one or more rinse ports.

In yet another embodiment, a nozzle assembly is provided. The nozzle assembly includes a body and an insert. The body includes an internal surface that defines an internal cavity disposed within the body, a first inlet disposed within the body, the first inlet fluid communication with the internal cavity, and a second inlet disposed within the body, the second inlet fluid communication with the internal cavity. The insert is partially disposed within the internal cavity, the insert being a monolithic body. The insert includes an outlet and a mixing chamber. The mixing chamber is disposed within the internal cavity, the mixing chamber includes a first port fluidly connecting the first inlet of the body to the mixing chamber, the first port disposed through a sidewall of the insert, and a second port fluidly connecting the second inlet of the body to the mixing chamber. The outlet is in fluid communication with the mixing chamber.

In yet another embodiment, a nozzle assembly is provided. The nozzle assembly includes a body and an insert. The body includes an internal surface that defines an internal cavity disposed within the body, a first inlet disposed within the body, the first inlet fluid communication with the internal cavity, a first shoulder disposed between the internal surface and an exterior face of the body, and a second inlet disposed within the body, the second inlet fluid communication with the internal cavity. The insert is partially disposed within the internal cavity, the insert being a monolithic body. The insert includes an outlet and a mixing chamber. The mixing chamber is formed within the insert. The mixing chamber includes a first port fluidly connecting the first inlet of the body to the mixing chamber and a second port fluidly connecting the second inlet of the body to the mixing chamber. The first port is tangentially aligned with an interior chamber surface of the mixing chamber. The outlet is in fluid communication with the mixing chamber. The nozzle assembly also includes a seal disposed in contact with a second shoulder of the body. The second shoulder disposed between the mixing chamber and the second inlet, the second shoulder configured to apply radial and axial force to the seal.

In yet another embodiment, a nozzle assembly is provided. The nozzle assembly includes a body and an insert. The body includes a first shoulder, a first inlet, a second inlet, and an internal surface that defines an internal cavity disposed within the body. The first inlet is disposed within the body and is in fluid communication with the internal cavity. The first shoulder is disposed between the internal surface and an exterior face of the body. The second inlet is disposed within the body and is in fluid communication with the internal cavity. The insert is partially disposed within the internal cavity and is a monolithic body. The insert includes an outlet and a mixing chamber. The mixing chamber is formed within the insert. The mixing chamber includes a first port fluidly connecting the first inlet of the body to the mixing chamber and a second port fluidly connecting the second inlet of the body to the mixing chamber. The first port is perpendicular to an axis of the mixing chamber. The outlet defines an acceleration tube. The nozzle assembly also includes accelerator disposed within the insert and opposite the outlet. The first port is disposed between the outlet and the accelerator. The accelerator includes a stem extending into the mixing chamber, a second port fluidly connecting the second inlet of the body to the mixing chamber, and an accelerator port disposed opposite the second port. The second port is disposed opposite the stem.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of the scope of the disclosure, as the disclosure may admit to other equally effective embodiments.

FIG. 4 is an isometric view of a nozzle body without a cap, according to one or more embodiments.

FIG. 7B is a cross-sectional view of the mixing chamber of claim 7A taken along line 7B-7B, according to one or more embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
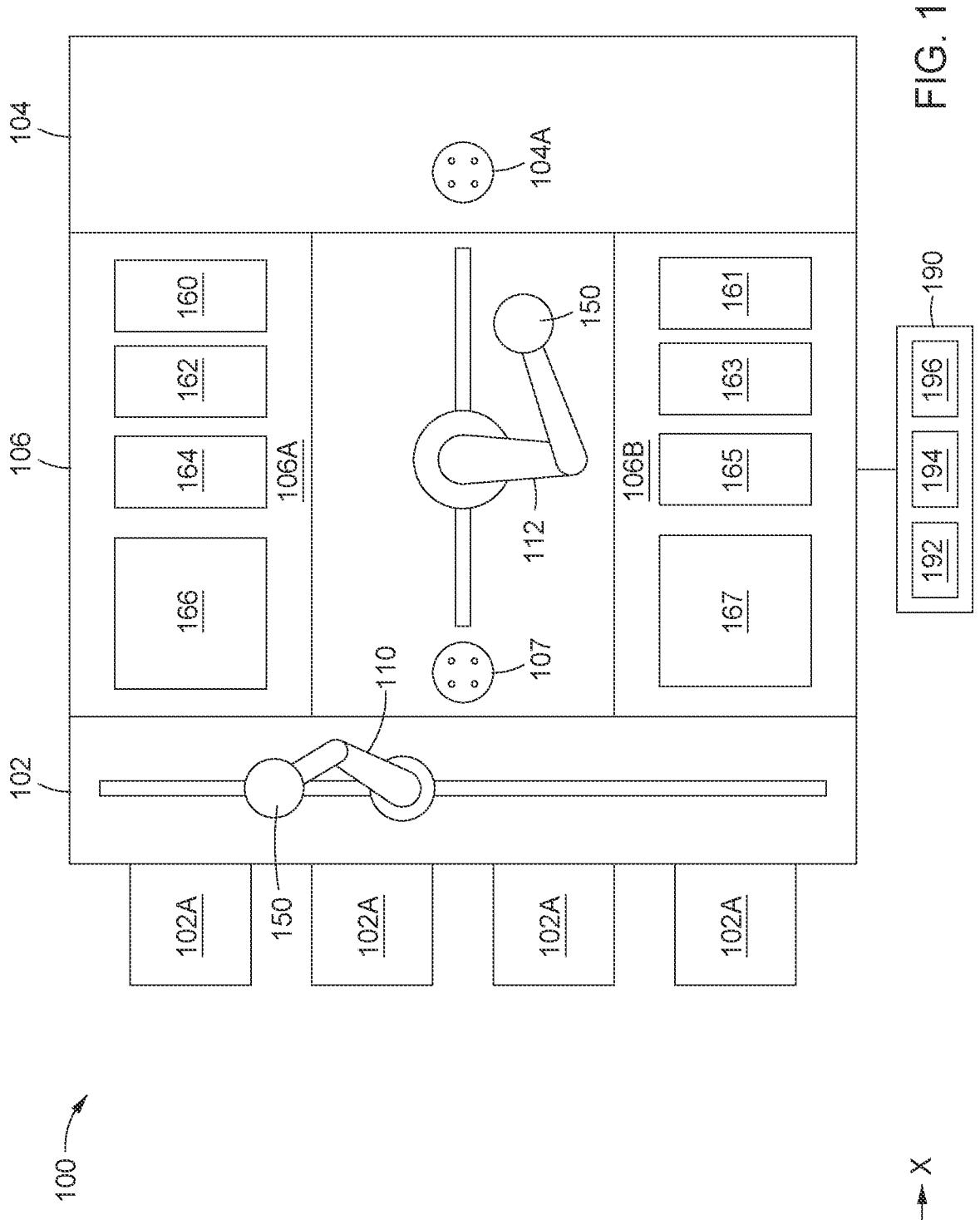
FIG. 1 is a schematic top view of an exemplary chemical mechanical polishing (CMP) processing system according to one or more embodiments.

FIG. 1 is a schematic plan view illustrating one embodiment of a chemical mechanical polishing (CMP) system 100, which uses an integrated clean and dry module described herein. The CMP system 100 includes a factory interface 102, a polishing unit 104, and a cleaning unit 106. The factory interface 102 may include one or more loading stations 102A. The loading stations 102A may be, for example, FOUPs or cassettes. Each loading station 102A may include one or more substrates 150 for CMP processing in the CMP processing system 100. A first substrate handler 110 is provided to transfer substrates 150 between the loading stations 102A and the cleaning unit 106. The first substrate handler 110 may also transfer substrates 150 from the cleaning unit 106 to the loading stations 102A. A second substrate handler 112 is also provided to transfer substrates 150 between the cleaning unit 106 and the polishing unit 104. For example, the first substrate handler 110 transfers a substrate 150 from a loading station 102A to the cleaning system 106, e.g., to a cleaner pass-through 107, where the substrate 150 can be picked up by the second substrate handler 112.

As shown in FIG. 1, the cleaning unit 106 may include two cleaning units 106A, 106B disposed in parallel to one another on opposite sides of the second substrate handler 112. The cleaning unit 106A may include a plurality of modules, such as a first cleaning module 160, a second cleaning module 162, a third cleaning module 164, and a fourth cleaning module 166. The cleaning unit 106B may include a plurality of modules, such as a first module 161, a second module 163, a third module 165, and a fourth module 167.

The first cleaning module 160 may be, for example, a pre-clean module that performs a pre-clean process, such as a buffing process, on the substrate 150 before the substrate 150 is transferred therefrom using the second substrate handler 112. The second cleaning module 162 and the third cleaning module 164 may be, for example, any one or combination of contact and non-contact cleaning systems for removing polishing byproducts from the surfaces of the substrate 150 before the substrate 150 is transferred therefrom using the second substrate handler 112, such as in cleaning systems commonly referred to as spray boxes and/or scrubber brush boxes. The fourth cleaning module 166 may be, for example, a drying unit or a final cleaning and drying unit.

According to an embodiment, the cleaning unit 106B may be essentially a mirror-duplicate of the cleaning unit 106A. In such a case, the first module 161 is similar to the first cleaning module 160, the second module 163 is similar to the second cleaning module 162, the third module 165 is similar to the third cleaning module 164, and the fourth module 167 is similar to the fourth cleaning module 166. Accordingly, the description herein and the depiction of cleaning unit 106A in the Figures is to be understood inferentially as also a description and depiction of cleaning unit 106B.

Alternatively, one or more of the first module 161, second module 163, third module 165, and fourth module 167 may be a module configured to perform a process other than a cleaning process. For example, one or more of the first module 161, second module 163, third module 165, and fourth module 167 may be a metrology station for measuring the thickness of a material layer disposed on the substrate 150 before and/or after polishing, to inspect the substrate 150 after polishing to determine if a material layer has been cleared from the field surface thereof, and/or to inspect the substrate surface for defects before and/or after polishing. As another example, one or more of the first module 161, second module 163, third module 165, and fourth module 167 may be a location specific (LSP) polishing module configured to polish only a portion of a substrate surface after the substrate 150 has been polished with a polishing module to touch up, e.g., remove additional material from, a relatively small portion of the substrate 150, for example, based on the measurement or surface inspection results obtained using a metrology station.

The cleaning units 106A, 106B may be separated by a cleaner pass-through 107 in which the second substrate handler 112 is positioned. The second substrate handler 112 may pick up the substrate 150 from the cleaner pass-through 107 and then transfer the substrate 150 to a transfer station 104A within the polishing unit 104. Following CMP processing on the substrate in the polishing unit 104, the second substrate handler 112 may retrieve the substrate 150 from the transfer station 104A within the polishing unit 104 and then transfer the substrate 150 to the first module 160 in the cleaning unit 106.

According to some embodiments, the second substrate handler 112 may also transfer the substrate 150 between the various modules (described above) of the cleaning units 106A, 106B. According to alternative embodiments, a third substrate handler (not shown) may be provided to transfer the substrate 150 between the various modules of the cleaning unit 106A, and a fourth substrate handler (not shown) may be provided to transfer the substrate 150 between the various modules of the cleaning unit 106B.

A controller 190, such as a programmable computer, is connected to elements of cleaning unit 106 and is configured to operate the elements of the cleaning module 106. For example, the controller 190 may control the loading, unloading and cleaning of substrates 150 by the cleaning unit 106.

The controller 190 can include a central processing unit (CPU) 192, a memory 194, and support circuits 196, e.g., input/output circuitry, power supplies, clock circuits, cache, and the like. The memory 194 and support circuits 196 are connected to the CPU 192. The memory 194 may be is a non-transitory computable readable medium, and can be one or more readily available memory such as random access memory (RAM), read only memory (ROM), floppy disk, hard disk, or other form of digital storage. In addition, although illustrated as a single computer, the controller 190 could be a distributed system, e.g., including multiple independently operating processors and memories. This architecture is adaptable to various cleaning situations based on programming of the controller 190 to control the order and timing that the substrates 150 are moved between the various modules of the cleaning unit 106, and to control individual operations of each of the various modules of the cleaning unit 106.

Figure 2:
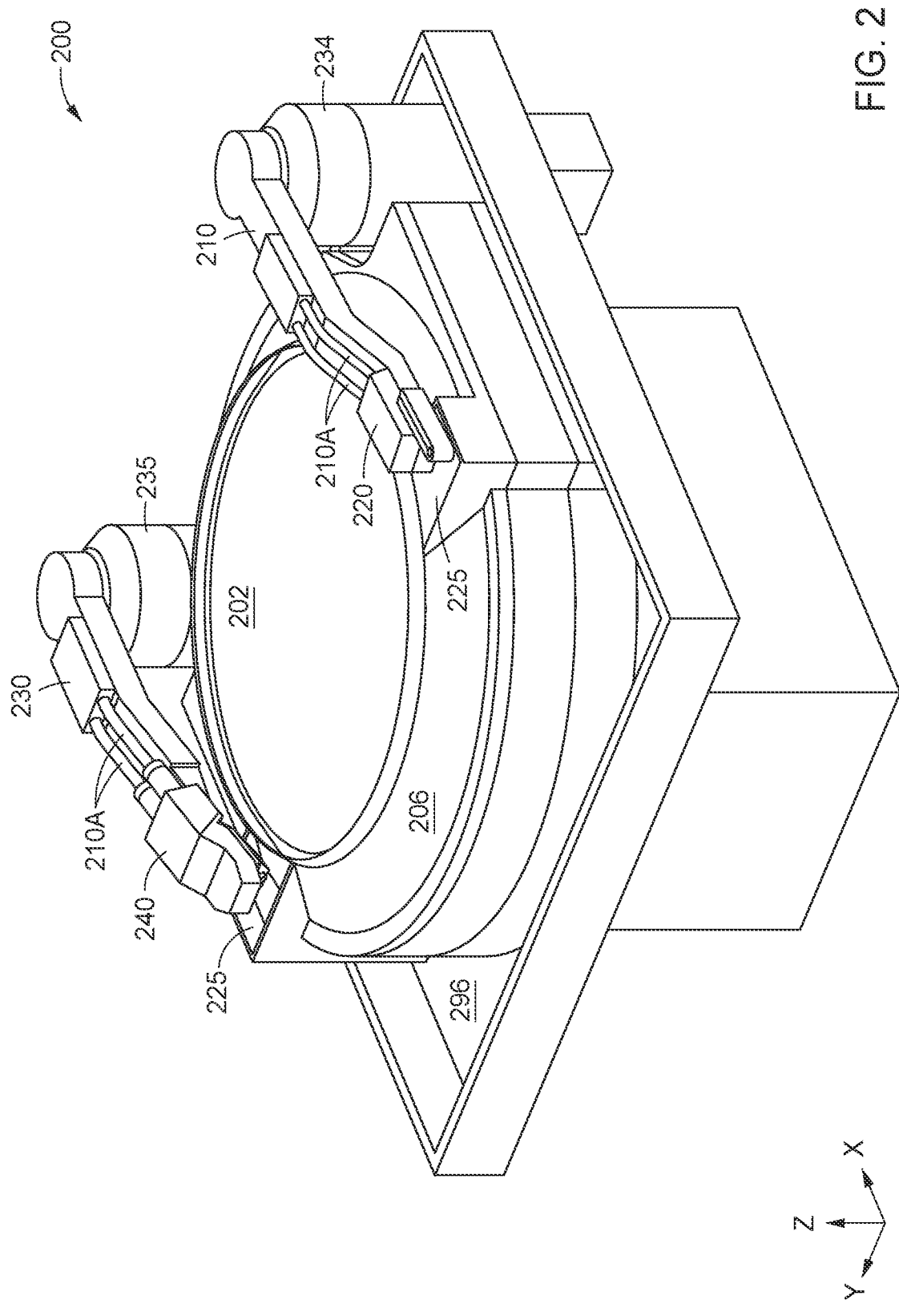
FIG. 2 is a top isometric view of the integrated cleaning and drying module with an enclosure thereof omitted, according to one or more embodiments.

FIG. 2 is an isometric view of an exemplary integrated cleaning and drying module 200, according to one or more embodiments. The integrated cleaning and drying module 200 is similar to the cleaning unit 106 of FIG. 1. The integrated cleaning and drying module 200 includes a first nozzle mechanism 220, which may be a drying nozzle configured to apply a drying agent such as isopropyl alcohol (IPA) and/or de-ionized water, and a second nozzle mechanism 240, which may be a megasonic nozzle that is configured to provide de-ionized water and megasonic energy to the surface of a substrate 150 (not shown for clarity) during processing. In some configurations, the second nozzle mechanism 240 may also be configured to apply a chemical cleaning agent, a rinsing agent, and/or a drying agent.

In some embodiments, the first nozzle mechanism 220 is a droplet jet nozzle for cleaning with high velocity DI water, cleaning chemical, or combination thereof and the second nozzle mechanism 240 is a droplet jet nozzle for rinsing with high velocity DI water, cleaning chemical, or combination thereof.

In some embodiments, the first nozzle mechanism 220 is a droplet jet nozzle for cleaning with high velocity DI water, cleaning chemical, or combination thereof and the second nozzle mechanism 240 is a megasonic jet nozzle for rinsing with high velocity DI water, cleaning chemical, or combination thereof.

In some embodiments, the first nozzle mechanism 220 is a droplet jet nozzle for cleaning with high velocity DI water, cleaning chemical, or combination thereof and the second nozzle mechanism 240 is not present.

When not dispensing a mixture, the nozzle mechanisms 220, 240 may be disposed above a nozzle cup 225. The first nozzle mechanism 220 and second nozzle mechanism 240 are coupled to nozzle arms 210. The nozzle arms 210 include nozzle supply lines 210a. The nozzle supply lines 210a may bring a chemical cleaning agent, a rinsing agent, and/or a drying agent, a fluid, a gas, and/or a liquid to the first nozzle mechanism 220 and/or the second nozzle mechanism 240. While two supply lines 210a are shown going to each nozzle mechanism 220, 240, multiple supply lines can got to each nozzle mechanism 220, 240. For example, each nozzle mechanism 220, 240 may each be connected to four supply lines 210a. In some embodiments, the first nozzle mechanism 220 may receive four supply lines 210a, and the second nozzle mechanism 240 may receive five supply lines 210a. The nozzle supply lines 210a are coupled to supply manifolds 230. The supply manifolds 230 are coupled to the nozzle arms 210. In other embodiments the manifolds 230 and the nozzle supply lines 210a are not coupled to the nozzle arms 210. The nozzle arms 210 are each connected to a first rotatable base 234 or second rotatable base 235. The rotatable bases 234, 235 and the manifolds 230 are connected to the controller 190 (FIG. 1). The manifolds 230 may include fluid control and monitoring devices that are connected to the controller 190. The controller 190 may be configured to open valves within or external to the manifolds 230 according to some embodiments. In other embodiments, the controller 190 may be configured to monitor flow rate and/or temperature of the fluid through the manifolds 230 and/or the supply lines 210a.

The rotatable bases 234, 235 are configured to dispose the first nozzle mechanism 220 and the second nozzle mechanism 240 above a process rotor 202. The process rotor 202 is configured to receive and rotate a substrate 150 for a CMP operation, such as a post CMP cleaning process. Excess mixture from the CMP operation flows down a ramp 206 and into a basin 296. The basin 296 catches the excess mixture for containment and recycling.

Figure 3:
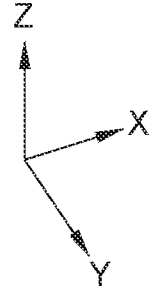
FIG. 3 is an isometric view of a nozzle body, according to one or more embodiments.

FIG. 3 is an isometric view of nozzle body assembly 300 according to some embodiments. The nozzle body assembly 300 may be disposed in a nozzle mechanism. For example, the nozzle body assembly 300 may be disposed in the first nozzle mechanism 220 and/or the second nozzle mechanism 240 of FIG. 2. The nozzle body assembly 300 includes a body 301, a cap 303, and rinse nozzles 305.

The body 301 includes a first inlet 307, one or more mount holes 309, rinse ports 319, and a spray face 311. The body 301 material is a corrosive resistant material. For example the body 301 material may be Polyether ether ketone (PEEK), a polymer, a ceramic, an alloy, or any combination thereof. The first inlet 307 is disposed within the body 301, and is configured to receive a fluid. In some embodiments, the first inlet 307 is a gas inlet. In some embodiments, the first inlet 307 is a liquid inlet. The first inlet 307 has a diameter between about 10 mm and about 25 mm. The fluid may be a gas, for example nitrogen gas ($N_2$).

The rinse nozzles 305 include one or more rinse nozzles 305. For example, the rinse nozzles 305 may include a first rinse nozzle 305a and a second rinse nozzle 305b such that the rinse nozzles 305 include two rinse nozzles. Each of the rinse nozzles 305 includes a rinse outlet 313. The rinse nozzles 305 are configured to dispense a fluid from the rinse outlets 313. The rinse outlets 313 are disposed a distance from the spray face 311 of the body 301 between about 5 mm and about 20 mm, for example 16 mm. The rinse outlets 313 have a diameter between about 0.5 mm and about 2 mm, for example 1 mm. The spray face 311 is an exterior face of the body 301. As an example, the rinse nozzles 305 may be configure to dispense DI water, but other fluids are contemplated. Each of the rinse nozzles 305 is configured to flow a fluid at a flow rate between about 15 ml/min and about 250 ml/min, for example 50 ml/min. The fluid leaving the rinse nozzles 305 is at a pressure between about 3 psi and about 50 psi, for example 15 psi.

The cap 303 includes an exit port 315 and a threaded region 507. The threaded region 507 is discussed in FIG. 5.

In some embodiments the body 301 includes one or more rinse ports 319. The rinse ports 319 are disposed opposite the spray face 311. The rinse ports 319 are fluidly connected to the rinse nozzles 305. In some embodiments, there are multiple rinse nozzles 305 and each rinse nozzle 305 is fluidly connected to an individual corresponding rinse port 319.

FIG. 4 is an isometric view of the nozzle body assembly 300 without the cap 303. The body 301 further includes an internal cavity 401, a cap port 405, a threaded region 407, and a seal feature 403. The internal cavity 401 is partially defined by an internal face 402 of the body 301. The cap port 405 is disposed in the spray face 311, and is dimensioned to receive the threaded region 507 (FIG. 5) of the cap 303. The cap port 405 has a diameter between about 10 mm and about 25 mm. The internal face 402 of the body 301 is a surface that includes the threaded region 407. The threaded region 407 is configured to receive the threaded region 507 (FIG. 5) of the cap 303. In some embodiments the seal feature 403 of the cap port 405 is a chamfer to accommodate and self-center a seal, such as an O-ring seal, that acts as a seal between the cap 303 and the spray face 311. Accordingly, other sealing methods, such as Teflon tape, which can cause contamination, can be avoided.

Figure 5:
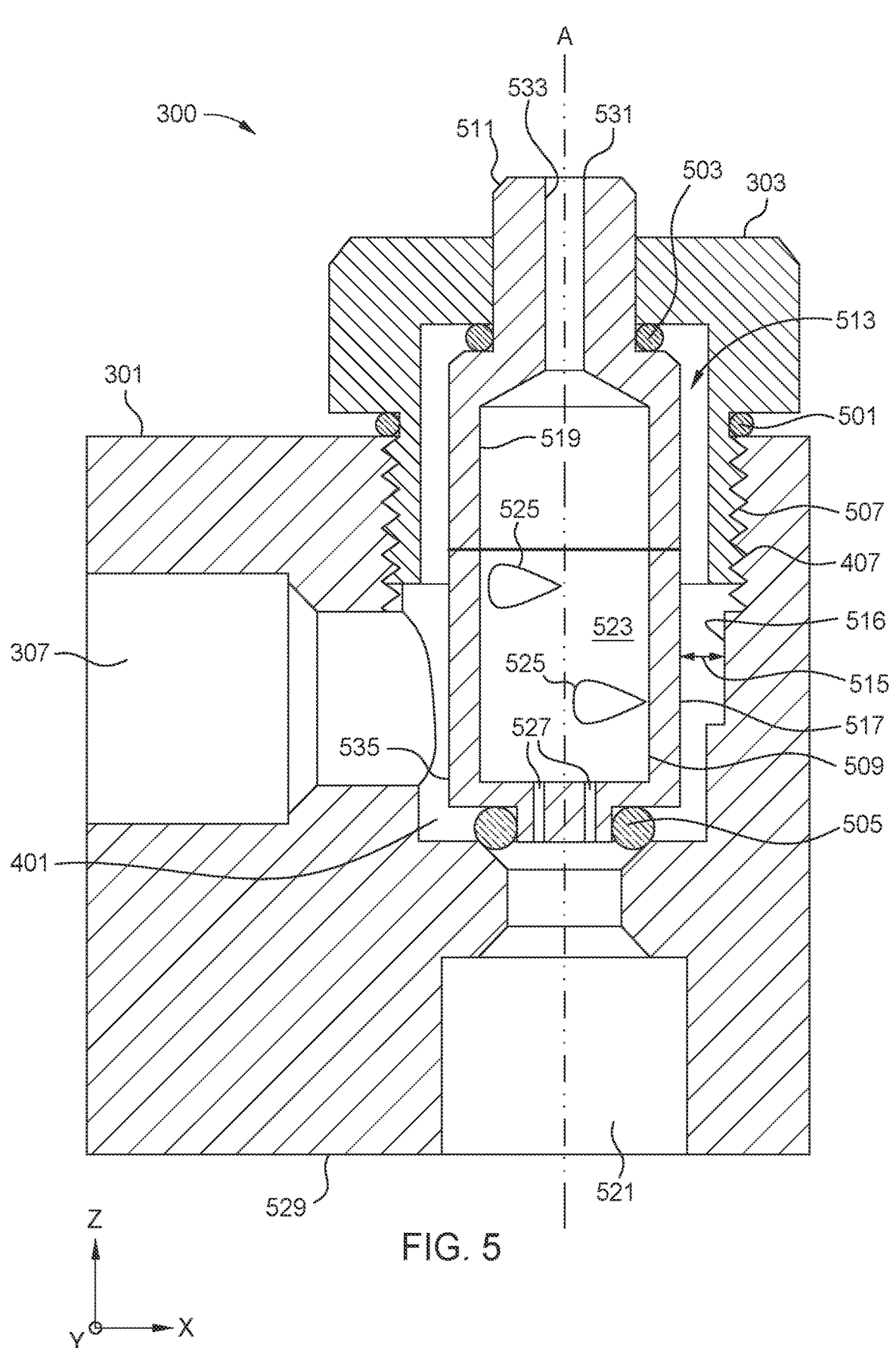
FIG. 5 is a side, cross-sectional view of the nozzle body of FIG. 3, according to one or more embodiments.

FIG. 5 is a side, cross-sectional view of the nozzle body assembly 300 according to some embodiments. The cap 303 includes a threaded region 507 configured to screw into the body 301. The cap 303 further includes a cap seal 501 and a chamber seal 503. The cap seal 501 is a seal disposed between the body 301 and the cap 303. The chamber seal 503 is a seal disposed between a mixing chamber 513 and the cap 303.

The nozzle body assembly 300 includes the mixing chamber 513, the chamber seal 503, the cap seal 501, an inlet mixing seal 505, a chamber axis A, and a second inlet 521. The internal cavity 401 is disposed within the body 301 and allows fluid communication between the first inlet 307, the second inlet 521, and the cap port 405 (FIG. 4). The mixing chamber 513 is disposed within the internal cavity 401 of the body 301.

The mixing chamber 513 includes an entry body 509, an exit body 511, an interior chamber surface 519, an exterior chamber surface 517, one or more first ports 525, one or more second ports 527, an outlet 531, an outlet channel 533, and a mixing body region 523 disposed within the body 301.

The exterior chamber surface 517 has a diameter between about 10 mm and about 20 mm, for example 11 mm. The mixing body region 523 is a region partially defined by the interior chamber surface 519 of the mixing chamber 513. The mixing body region 523 is where fluid from the first inlet 307 and fluid from the second inlet 521 mix to form a fluid mixture. The fluid mixture can then be delivered outside the body 301. The fluid from the second inlet 521 enters the mixing chamber 513 into the mixing body region 523 through the one or more second ports 527. The fluid from the first inlet 307 enters the mixing chamber 513 into the mixing body region 523 through the one or more first ports 525. The first ports 525 are disposed through the sidewalls 535 of the mixing chamber 513. The first ports 525 are in fluid communication with and fluidly connect the first inlet 307 to the mixing chamber 513. The first ports 525 are also in fluid communication with an annular gap 515.

The annular gap 515 is the space disposed between the mixing chamber 513 and an internal surface 516 of the internal cavity 401. In other embodiments, the annular gap 515 is the space disposed between a nozzle shroud 801 (FIG. 8) and an internal surface 516 of the internal cavity 401. The annular gap 515 is configured to be filled with a gas that will enter the mixing body region 523 tangentially through the first ports 525, thereby generating a swirl and/or vortex effect. The one or more second ports 527 are in fluid communication with and fluidly connect the second inlet 521 to the mixing chamber 513. The flow rate of the fluid from the second inlet 521 is between about 15 ml/min and about 250 ml/min, for example 25 ml/min. The flow rate of the fluid from the first inlet 307 is between about 25 L/min and about 150 L/min, for example 70 L/min. The pressure of the fluid from the second inlet 521 is between about 15 psi and about 60 psi, for example 45 psi. The pressure of the fluid from the first inlet 307 is between about 15 psi and about 60 psi, for example 45 psi.

The chamber seal 503 is disposed between the cap 303 and the exit body 511. The cap seal 501 is disposed between the body 301 and the cap 303. The inlet mixing seal 505 is disposed between the entry body 509 and the body 301. In some embodiments, the cap seal 501, the chamber seal 503, and the inlet mixing seal 505 are O-rings made of fluo-roelastomers due to their high chemical resistive properties. The cap seal 501, the chamber seal 503, and the inlet mixing seal 505 are configured to each provide a fluid seal to spaces formed within the body 301. For example, the spaces may include the annular gap. The seals 501, 503, and 505 may provide a fluid seal to spaces thereby ensuring that a fluid from the first inlet 307 and the fluid from the second inlet 521 do not come into contact until they reach the mixing body region 523. Further, the seals 501, 503, and 505 may ensure that the subsequent mixture only travels out of the outlet 531. This ensures that the outlet 531 delivers the fluid mixture to a region outside of the nozzle assembly 300. The body 301 also includes a bottom face 529. The bottom face 529 includes the second inlet 521. In some embodiments the second inlet 521, the first inlet 307 and the rinse ports 319 are ⅛ NPT threaded ports and include chamfers configured to receive self-centering, face sealing, O-rings. The exit body 511 extends through exit port 315 of the cap 303. The outlet channel 533 is disposed within the exit body 511 and is concentric with the chamber axis A. The outlet channel 533 enables fluid communication between the mixing body region 523 and the outlet 531. The outlet is configured to deliver a mixture out of the body 301.

Figure 6:
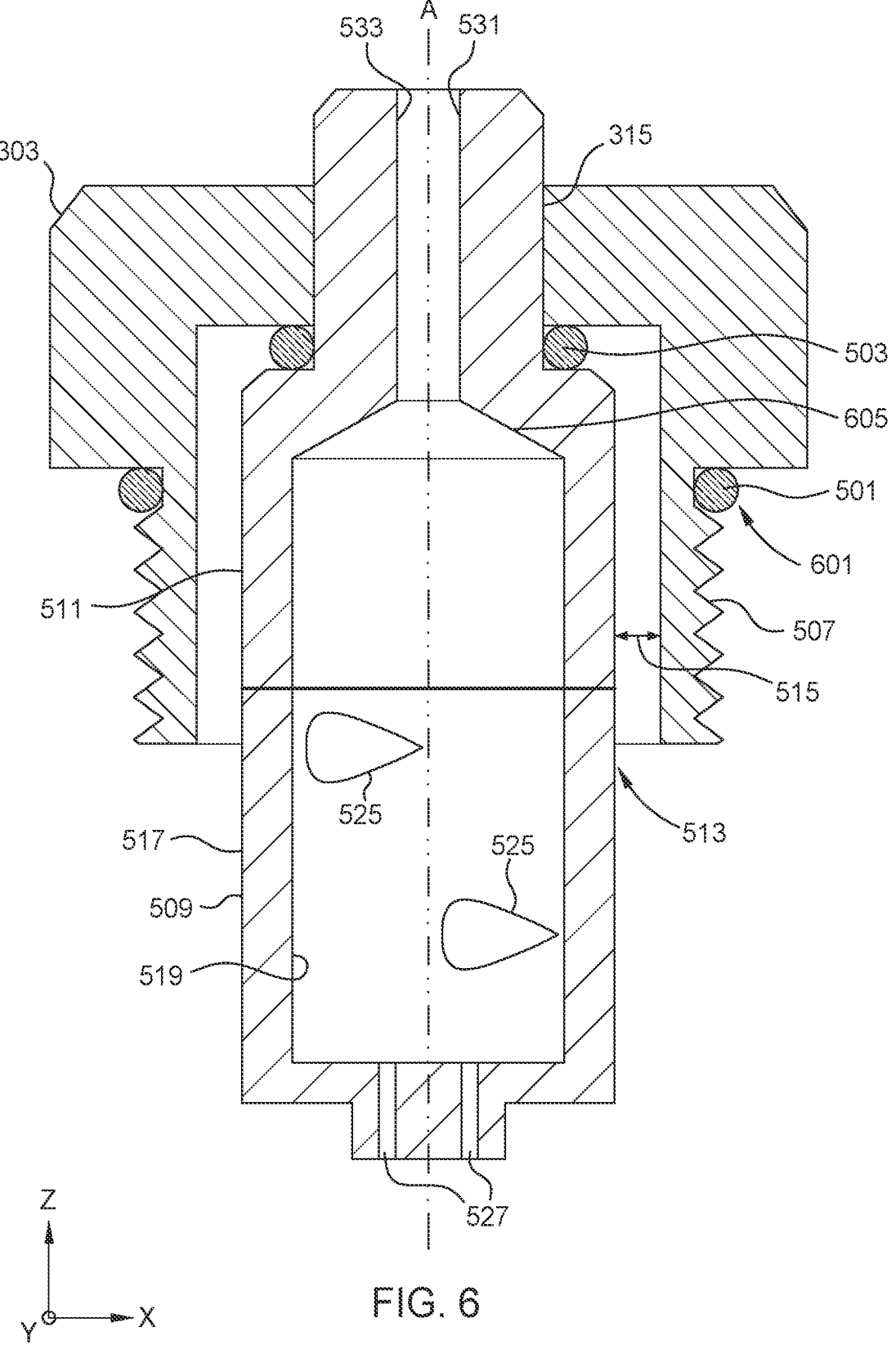
FIG. 6 is a cross-sectional view of part of the nozzle body of FIG. 5, according to one or more embodiments.

FIG. 6 is a cross-sectional view of the mixing chamber 513 disposed through the cap 303 according to some embodiments. According to some embodiments, the entry body 509 and exit body 511 are a single part. In other embodiments, the entry body 509 and exit body 511 are two separate parts.

As illustrated, the cap 303 includes a seal recess 601 that is configured to hold the cap seal 501 in place between the cap 303 and the spray face 311 (FIG. 3). The entry body 509 includes one or more second ports 527 disposed opposite the exit body 511 and configured to let fluid from the second inlet 521 (FIG. 5) into the mixing chamber 513. The entry body 509 is disposed adjacent to the second inlet 521 of the body 301. The exit body 511 includes a reducing cone 605 disposed between an outlet channel 533 and the mixing body region 523. The outlet channel 533 ends in the outlet 531. The outlet 531 is disposed on the exit body 511, opposite the entry body 509, and through exit port 315 of the cap 303. In some embodiments, the rinse outlets 313 (FIG. 3) may be disposed farther from the body 301 than the outlet 531. The outlet channel 533 length is defined between the reducing cone 605 and the outlet 531. The outlet channel 533 length is between about 7 mm and about 20 mm, for example 11 mm. The outlet 531 has a diameter between about 0.5 mm and about 2.5 mm, for example 1.9 mm. The outlet 531 is in fluid communication with the mixing chamber 513. The chamber seal 503 is disposed around the exterior surface 517 of the mixing chamber 513, between the exit body 511 and the cap 303. The chamber seal 503 keeps any fluid in the annular gap 515 from escaping. The reducing cone 605 can have an angle range from between about 45° to about 120°. In some embodiments, the reducing cone 605 has an angle of between about 100° and 120°, such as about 118°. In some embodiments, the backpressure generated by the outlet channel 533 is between about 30 psi and about 60 psi. In other embodiments, an outlet channel 533 diameter of 1.9 mm may generate a backpressure of 37.5 psi.

Figure 7A:
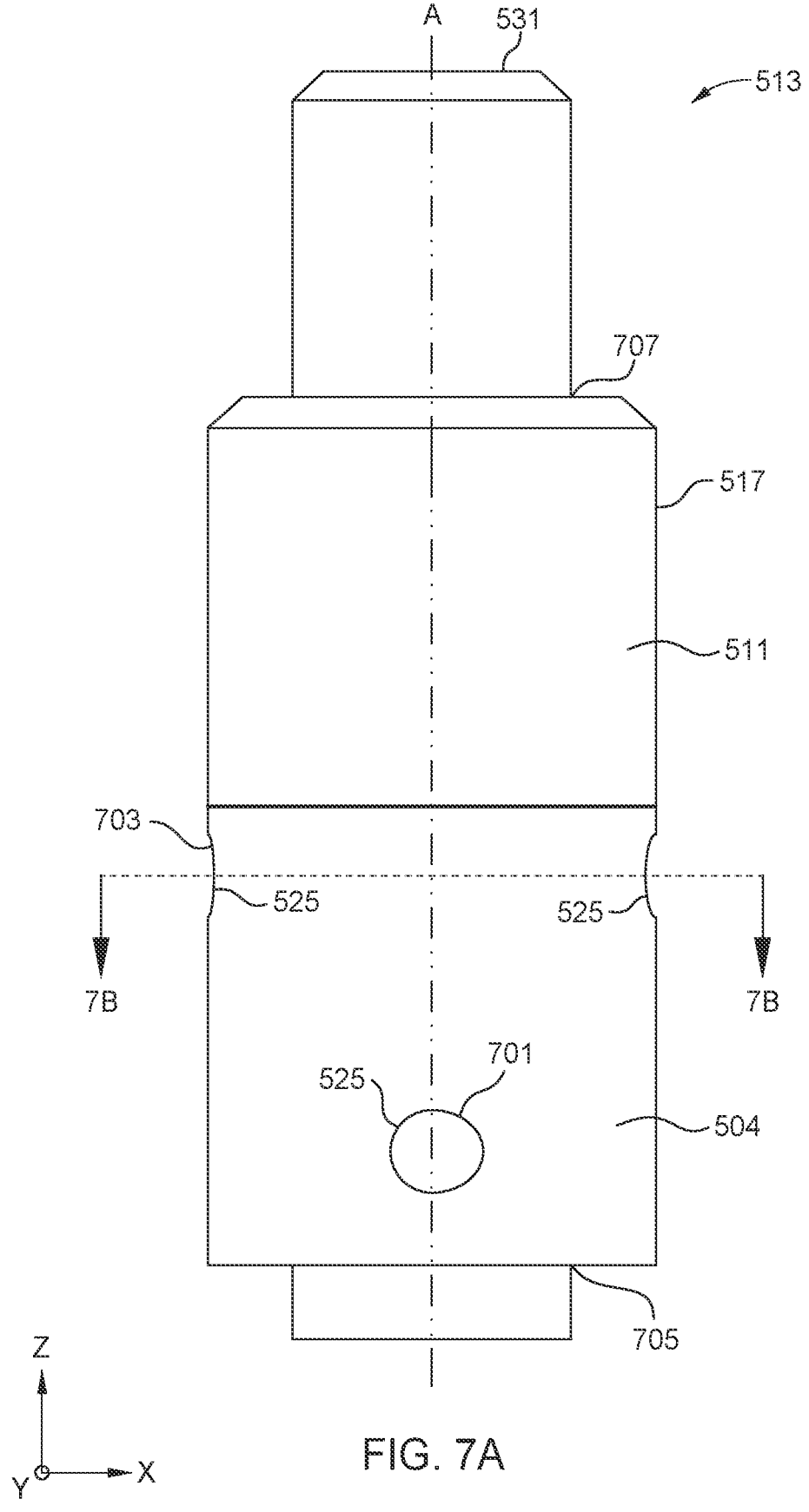
FIG. 7A is a side view of a mixing chamber of FIG. 5, according to one or more embodiments.

FIG. 7A illustrates a side view of the mixing chamber 513 according to some embodiments. As shown the mixing chamber 513 includes an inlet shoulder 705, and a chamber seal shoulder 707. The inlet shoulder 705 is configured to hold the inlet mixing seal 505 (FIG. 5). The chamber seal shoulder 707 is configured to hold the chamber seal 503 (FIG. 5).

In some embodiments, the first ports 525 include primary gas ports 701 and secondary gas ports 703. The primary gas ports 701 are disposed closer to the inlet shoulder 705 than the secondary gas ports 703. The secondary gas ports 703 are disposed closer to the exit body 511. The distance between the primary gas ports 701 and secondary gas ports 703 along the Z axis is between about 3 mm and about 10 mm, for example 4 mm. The primary gas ports 701 have a diameter between about 0.4 mm and about 1.5 mm, for example 1 mm. The secondary gas port 703 have a diameter between about 0.4 mm and about 1.5 mm, for example 1 mm. In some embodiments there are two primary gas ports 701. In other embodiments, there is one primary gas port 701. In other embodiments there are three or more primary gas ports 701. In some embodiments there are two secondary gas ports 703. In other embodiments, there is one secondary gas port 703. In other embodiments there are 3 or more secondary gas ports 703. Different embodiments may be combined with other embodiments depending on the desired mixing characteristics and operation parameters.

FIG. 7B is a cross section of entry body 509 of the mixing chamber 513 taken along lines 7B-7B of FIG. 7A. The primary gas ports 701 (shown with hidden lines) and secondary gas ports 703 of the entry body 509 are configured to create a swirl effect within the mixing body region 523. According to some embodiments, the first ports 525 are arranged in an array. For example, the primary gas ports 701 are disposed opposite each other and the secondary gas ports 703 are disposed opposite each other at their respective distance along the mixing chamber 513. For example, each first port 525 will be in its own quadrant, rotated 90° from one another, through the entry body 509. In some embodiments there are five or more first ports 525 arranged in a radial array around the chamber axis A. The first ports 525 are tangentially aligned with the interior surface 519 of mixing chamber 513. The first ports 525 allow a fluid to enter into the mixing body region 523 tangentially to the interior surface 519 of the mixing chamber 513 creating a swirl effect that is beneficial for mixture uniformity. The fluid from the first ports 525 creates a swirling effect with the fluid entering the mixing body region 523 from one or more second ports 527. The one or more second ports 527 fluidly connect the mixing body region 523 with the second inlet 521 (FIG. 5). The diameter of each fluid channel is between about 0.1 mm and about 1 mm, for example 0.35 mm. The swirling effect creates an internally atomized mixture with complex fluid structures. The two-phase homogenization and atomization process starts by breaking down the liquid stream in the gas swirl.

Figure 8:
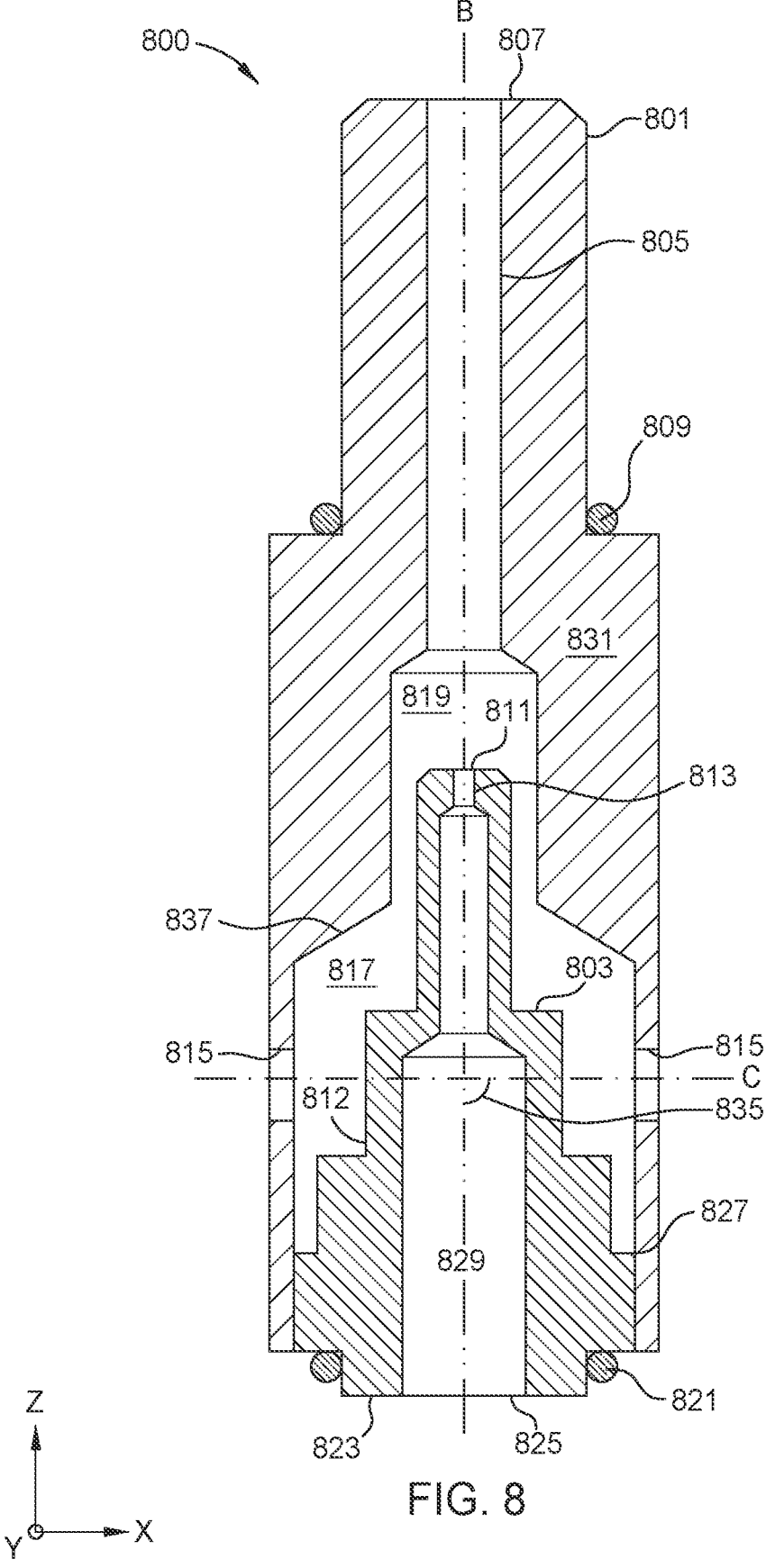
FIG. 8 is a cross-sectional view of part of an axial nozzle assembly, according to one or more embodiments.

FIG. 8 illustrates a side cross-sectional view of an axial nozzle assembly 800 according to some embodiments. The axial nozzle assembly 800 can be used in place of the mixing chamber 513 of FIGS. 5-7. In other words, the axial nozzle assembly 800 can replace the mixing chamber 513 to form the nozzle assembly 300. The axial nozzle assembly 800 includes a nozzle shroud 801, an accelerator 803, a chamber seal 809, an accelerator seal 821, and central axis B. In some embodiments, the nozzle shroud 801, the accelerator 803 and the cap 303 (FIG. 3) are a single body. In other embodiments, the nozzle shroud 801 and the accelerator 803 are a single body. In other embodiments, the nozzle shroud 801 and the cap 303 are a single body. When assembled, the accelerator 803 is disposed within the nozzle shroud 801. The nozzle shroud 801 is disposed within internal cavity 401 of the body 301 and secured by the cap 303 (not shown). The chamber seal 809, and the accelerator seal 821 are used to keep fluids from the first inlet 307 (FIG. 5) and second inlet 521 (FIG. 5) separate until reaching a mixing region 819.

The nozzle shroud 801 includes an outlet channel 805 with an exit port 807, one or more radial gas ports 815, a shroud body 831, the central axis B, and the mixing region 819. The exit port 807 and the outlet channel 805 share a diameter between about 0.5 mm and about 2 mm, for example 1.6 mm. The one or more radial gas ports 815 are disposed along one or more port axes C. The port axes C are disposed an angle 835 from the central axis B. The angle 835 is between about 10° to about 135°, for example 90°. In some embodiments the port axes C are orthogonal to the central axis B. For each of the one or more radial gas ports 815, there is a corresponding port axis C. The one or more radial gas ports 815 are disposed through the shroud body 831, and in fluid communication with the mixing region 819.

The accelerator 803 includes a fluid cavity 829, a fluid stem 813, an accelerator port 811, an inlet face 823, and an exterior accelerator surface 812. The fluid cavity 829 is fluidly connected to the second inlet 521 (FIG. 5) by a cavity inlet 825. The fluid cavity 829 is the space within and through the accelerator 803. The fluid cavity 829 decreases in diameter until it reaches the fluid stem 813. The fluid stem 813 fluidly connects the fluid cavity 829 to the mixing region 819. The accelerator 803 contacts the nozzle shroud at the contact interface 827. In some embodiments the contact interface 827 is an inference fit between the accelerator 803 and the nozzle shroud 801. The inference fit may include a transition fit which is established by controlling tolerances. On tightening the cap 303 (FIG. 3), O-rings present proximate to the contact interface 827 will compress to act as a face seal. Diameter and thickness of O-ring and tolerance stack-up is leveraged to evenly spread the compressive force across one or more O-rings in the embodiments. A fluid enters an acceleration region 817 through the one or more radial gas ports 815. The acceleration region 817 is the space between the accelerator port 811 and the one or more radial gas ports 815. An acceleration surface 837 and the exterior accelerator surface 812 partially define the acceleration region 817. The fluid leaves the accelerator 803 and enters the mixing region 819 in the nozzle shroud 801 to begin atomization. The accelerator 803 has several steps which partially define the acceleration region 817 and aid in axial gas flow and core cavity for liquid flow. The acceleration region 817 volume is determined by the mixing region 819 volume and the stem outer diameter 913 (FIG. 9).

Figure 9:
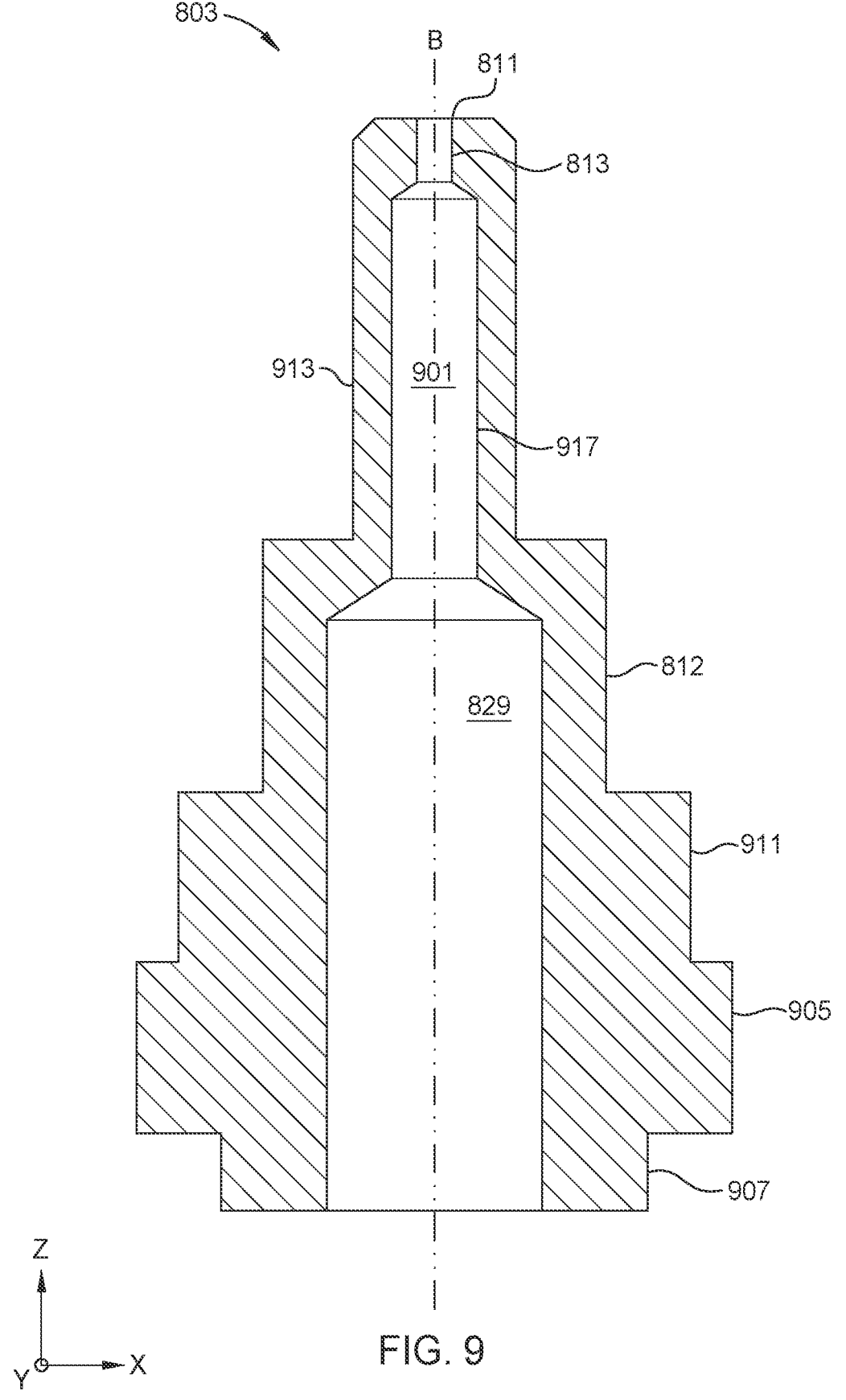
FIG. 9 is a cross-sectional view of a nozzle accelerator, according to one or more embodiments.

FIG. 9 is a side, cross-sectional view further illustrating the accelerator 803 according to some embodiments. The accelerator 803 includes a seal shoulder 907, a liquid annulus 901, an accelerator contact face 905, and the exterior accelerator surface 812. The exterior accelerator surface 812 includes a stepped surface 911. The stepped surface 911 is configured to reduce the volume of the acceleration region 817, to aid in accelerating fluid from the radial gas ports 815 into the mixing region 819 (FIG. 8). As fluid enters the fluid cavity 829 of the accelerator 803, it is accelerated though the liquid annulus 901, to the fluid stem 813, and leaves via the accelerator port 811. The fluid stem 813 has a diameter between about 0.1 mm to about 1 mm, for example 0.35 mm. The liquid annulus 901 is partially defined by internal accelerator walls 917. The accelerator contact face 905 is configured to contact the nozzle shroud 801 at the contact interface 827 (FIG. 8). The seal shoulder 907 is configured to align the accelerator 803 within the body 301 (FIG. 3). In some embodiments the stem outer diameter 913 is between about 1.25 mm to about 3 mm, for example 2 mm. The accelerator 803 is used to streamline a liquid and a gas along the central axis B. The fluid cavity 829 of the accelerator 803 is used to generate a liquid stream that is delivered into the mixing region 819. The dimensions of the fluid cavity 829 and the flow rate of the liquid through the fluid cavity 829 can be used to control the velocity of the subsequent mixture.

Figure 10:
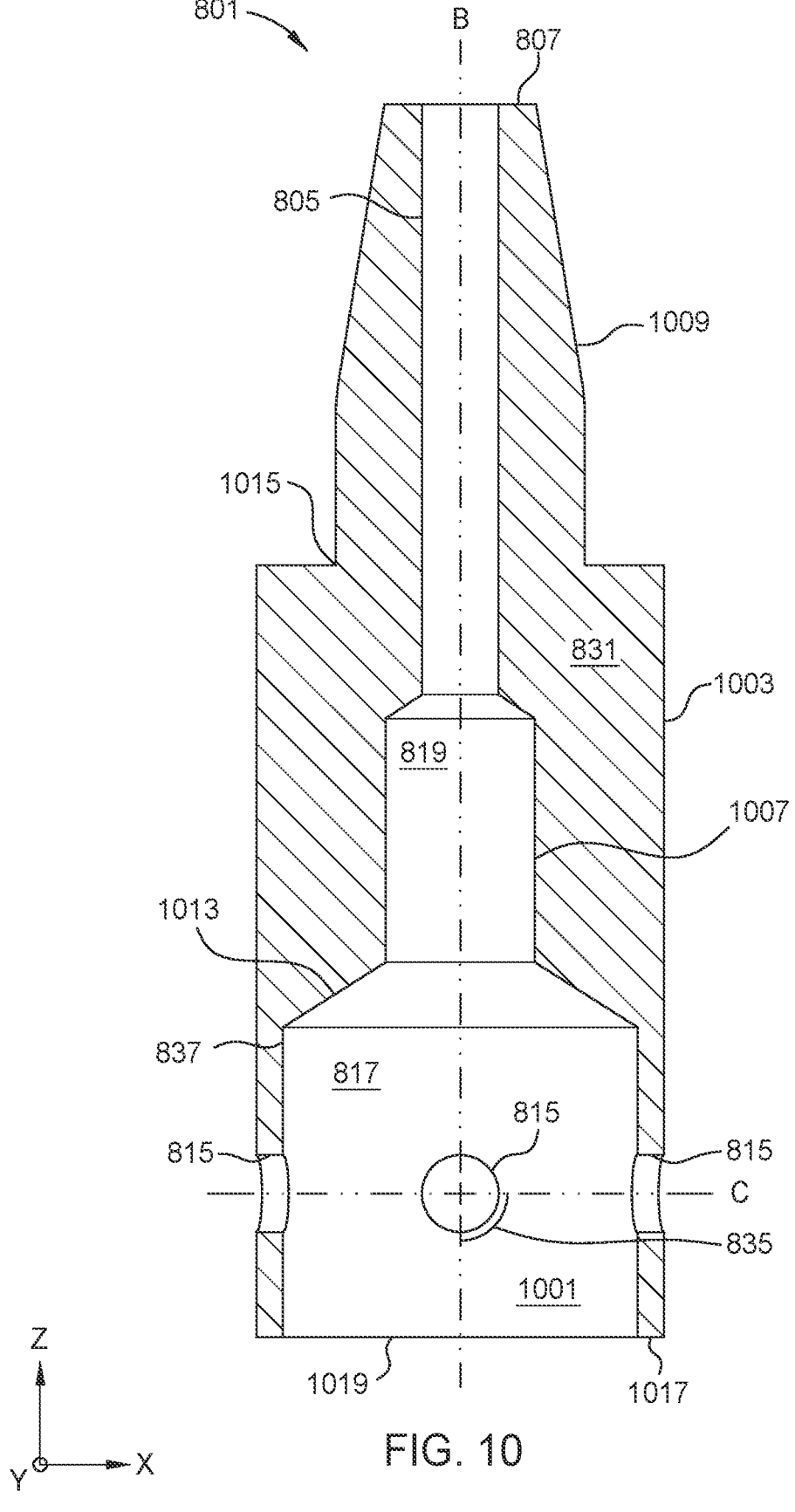
FIG. 10 is a cross-sectional view of a nozzle shroud, according to one or more embodiments.

FIG. 10 is a side, cross-sectional view further illustrating the nozzle shroud 801 according to some embodiments. The nozzle shroud 801 includes, a mixing surface 1007, a nozzle 1009, the acceleration surface 837, an accelerator port 1019, a seal shoulder 1015, a lower side 1017, the shroud body 831, and multiple internal areas. The areas include the accelerator cavity 1001, the acceleration region 817, the mixing region 819, and the outlet channel 805. The accelerator cavity 1001 is the space where the accelerator 803 is disposed when assembled. The accelerator cavity 1001 has a diameter between about 6 mm and about 16 mm, for example 7 mm. The mixing surface partially defines the mixing region 819. The nozzle 1009 is the region of the nozzle shroud 801 that extends through the cap 303 (not shown) and includes the outlet channel 805 and the exit port 807. The acceleration surface 837 includes a reducing surface 1013 configured to build up back pressure. The mixing surface 1007 includes a diameter between about 1.5 mm to about 4 mm, for example 2.5 mm.

The shroud body 831 has one or more radial gas ports 815 along the port axes C, at an angle 835 to the central axis B. For example, the shroud body 831 may have four radial gas ports 815. In another example, the shroud body 831 may have more than four radial gas ports 815. In another embodiment, the shroud body 831 may have two or more radial gas ports 815. The radial gas ports 815 are configured to receive fluid through the annular gap 515 from the first inlet 307 (FIG. 5). The fluid from the first inlet 307 translates through the annular gap 515 (not shown), through the radial gas ports 815, and into the acceleration region 817. In some embodiment the annular gap 515 is the space between a shroud exterior surface 1003 and the internal cavity 401 (not shown). The mixing region 819 initiates atomization by backpressure generated by the reducing surface 1013. The nozzle 1009 includes the outlet channel 805 that aids in making the atomized mixture in the mixing region 819 uniform before it leaves the exit port 807. The outlet channel

805 and exit port 807 diameter is between about 1 mm to about 3 mm, for example 1.6 mm. In some embodiments, during process operation a back pressure between about 30 psi and about 60 psi is created when the exit port 807 diameter is between about 1 mm to about 3 mm. For example, an exit port diameter of 1.6 mm may produce about 45 psi of back pressure according to some embodiments.

Figure 11:
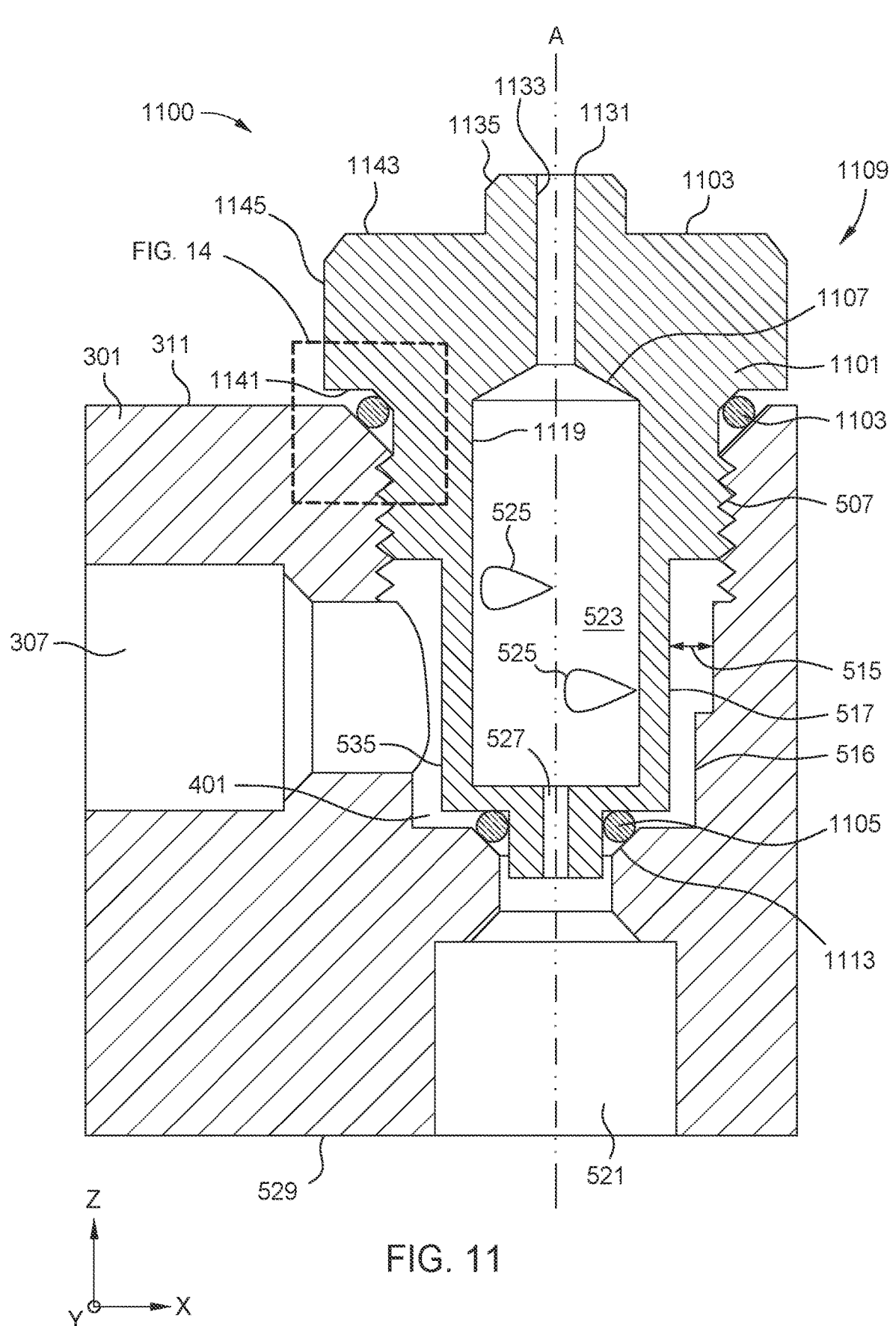
FIG. 11 is a cross-sectional view of part of a nozzle assembly, according to one or more embodiments.

FIG. 11 is a side, cross-sectional view of a nozzle assembly 1100 according to some embodiments. The nozzle assembly 1100 includes the body 301, a first seal 1103, a second seal 1105, and a nozzle insert 1101.

The nozzle insert 1101 is disposed within the body 301. The nozzle insert 1101 comprises a mixing chamber 1107, an outlet 1131, and an acceleration tube 1133. The nozzle insert 1101 is disposed within the internal cavity 401 of the body 301 FIG. 4.

The mixing chamber 1107 includes an interior chamber surface 1119, the exterior chamber surface 517, the one or more first ports 525, the one or more second fluid ports 527, and the mixing body region 523.

The mixing body region 523 is a region partially defined by the interior chamber surface 1119 of the mixing chamber 1107. The fluid from the second inlet 521 enters the mixing body region 523 of the mixing chamber 1107 through the second fluid port 527. The second fluid port 527 is in fluid communication with and fluidly connects the second inlet 521 to the mixing chamber 1107. The fluid from the first inlet 307 enters the mixing chamber 1107 and into the mixing body region 523 through the one or more first ports 525. The one or more first ports 525 are in fluid communication with and fluidly connect the first inlet 307 to the mixing chamber 1107. The first ports 525 are disposed through the sidewalls 535 of the nozzle insert 1101. The first ports 525 are tangentially aligned with an interior chamber surface of the mixing chamber 1119. The annular gap 515 is the space disposed between the nozzle insert 1101 and the internal surface 516 of the internal cavity 401.

In some embodiments, the first seal 1103 and the second seal 1105 are O-rings made of fluoroelastomers due to their high chemical resistive properties.

The seals 1103, 1105 are configured to each provide a fluid seal to the internal cavity 401, the mixing body region 523 the first inlet 307, and the second inlet 521 from each other so that mixing of fluids is confined to the mixing body region 523.

The seals 1103, 1105 may provide a fluid seal to spaces thereby ensuring that a fluid from the first inlet 307 and the fluid from the second inlet 521 do not come into contact until they reach the mixing body region 523. Further, the seals 1103, 1105 may ensure that the subsequent mixture only travels out of the outlet 1131. This ensures that the outlet 1131 delivers the fluid mixture to a region outside of the nozzle assembly 300.

The configuration and interaction of the nozzle insert 1101, the body 301, and the seals 1103, 1105 is discussed below in regards to FIG. 14.

In some embodiments, the nozzle insert 1101 is a single monolithic body. The nozzle insert 1101 may further include a cap portion 1109 and threaded region 507. The cap portion 1109 is configured to apply force to the first seal 1103 when the threaded region 507 of the nozzle insert 1101 interacts with the threaded region 407 of the body 301. For example, as the nozzle insert 1101 is rotated, the nozzle insert 1101 translates along the A axis into the body 301, thereby compressing the first seal 1103 and the second seal 1105. The second seal 1105 is disposed against a shoulder 1113 of the internal surface 516 of the internal cavity 401. The shoulder 1113 and the second seal 1105 allow the nozzle insert 1101 to be centered within the second inlet 521. As the nozzle insert 1101 is threaded into the body 301, the chamfered shoulder 1113 allows an axial and radial force to be induced within the second seal 1105, compressing the second seal 1105. In some embodiments, the one or more second ports 527 are about parallel with the central axis A.

The cap portion 1109 is defined between a first face 1141 and a second face 1143. The first face 1141 is configured to serve as a stop when threading the nozzle insert 1101 into the body 301. The cap portion 1109 has a diameter defined by a radially outward face 1145. The diameter of the radially outward face 1145 is greater than the diameter of the internal cavity 401.

The acceleration tube 1133 fluidly couples the mixing chamber 1107 with the outlet 1131. The outlet 1131 is disposed in a nozzle portion 1135 of the cap portion 1109. The nozzle portion 1135 is an extension from the second face 1143 of the cap portion 1109. The cap portion 1109 allows for increased length of the acceleration tube 1133 and for enhanced atomization of process fluids.

In some embodiments, the body further comprises seals in the first inlet 307 and second inlet 521 that are compressed when fluid lines are connected to the body.

By forming the nozzle insert 1101 out of a single body, the number of seals may be reduced, thereby reducing the number of potential places leaks may occur.

Figure 12:
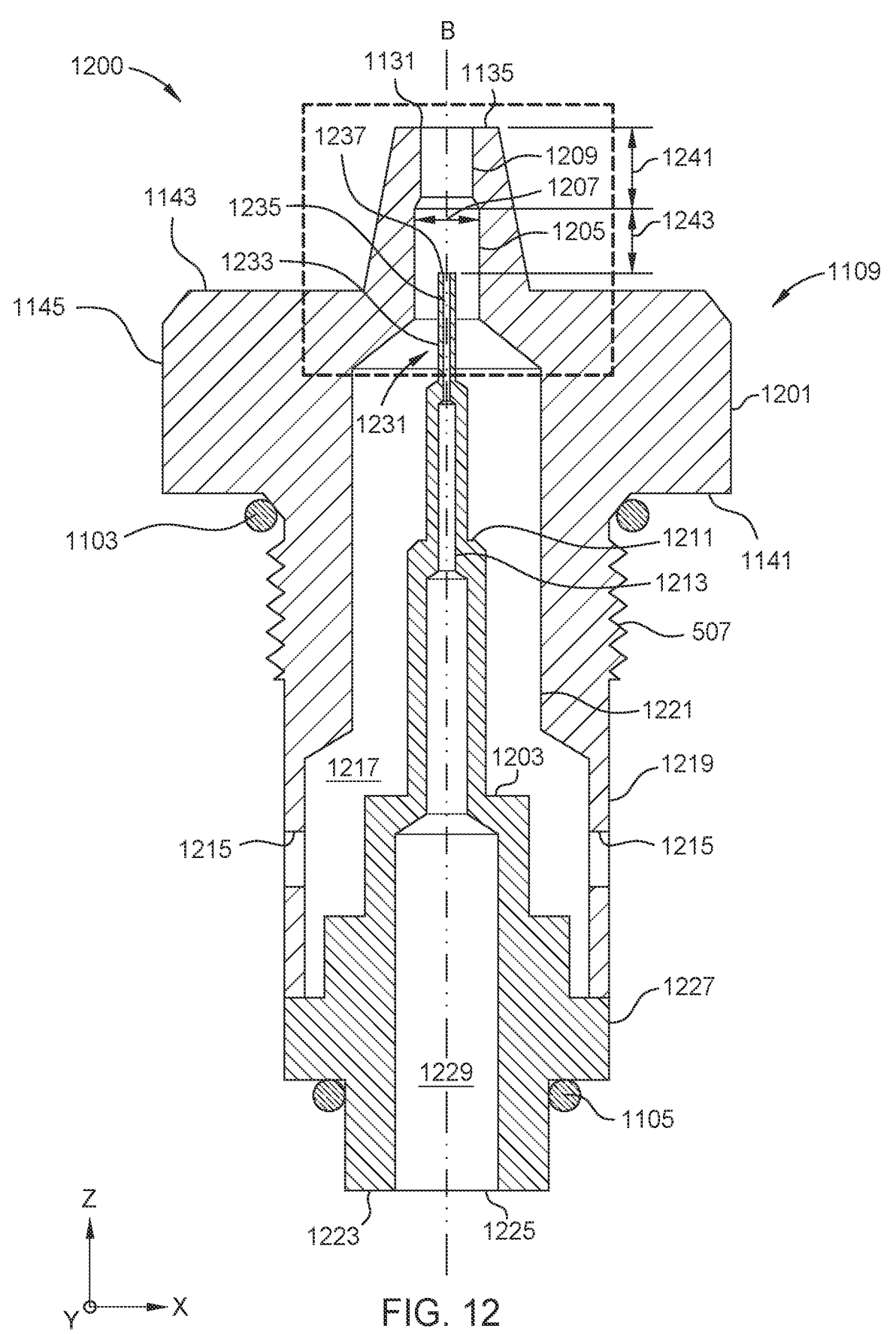
FIG. 12 is a cross-sectional view of part of a nozzle assembly, according to one or more embodiments.

FIG. 12 is a side, cross-sectional view of a nozzle assembly 1200 according to some embodiments. The nozzle assembly 1200 includes an insert 1201, an accelerator 1203, the first seal 1103, the second seal 1105, and central axis B.

The nozzle assembly 1200 can be used in place of the mixing chamber 513 of FIGS. 5-7. In other words, the nozzle assembly 1200 can replace the nozzle assembly 1100.

In some embodiments, the insert 1201 and the accelerator 1203 are a single body. In other embodiments, the insert 1201 and the accelerator 1203 are two bodies.

The insert 1201 is disposed within the internal cavity 401 of the body 301 (FIG. 4). The insert 1201 includes, one or more first ports 1215, the nozzle portion 1135, the central axis B, an outlet 1131, and an inner surface 1221. The inner surface 1221 defines a mixing chamber 1205, an acceleration tube 1209, and an acceleration region 1217.

In some embodiments, the outlet 1131 and the acceleration tube 1209 share a diameter. For example, the diameter of the outlet 1131 is about 0.1 mm to about 4 mm. The acceleration tube 1209 fluidly connects the outlet 1131 to the mixing chamber 1205.

The one or more first ports 1215 are disposed through the sidewalls 1219 of the insert 1201, and in fluid communication with an acceleration region 1217 of the insert 1201 and the mixing chamber 1205. The one or more first ports 1215 are disposed about perpendicular to the central axis B of the insert 1201.

When assembled, the accelerator 1203 is disposed within the insert 1201, opposite the outlet 1131. The accelerator 1203 is disposed within the acceleration region 1217 of the insert 1201.

The accelerator 1203 includes a fluid cavity 1229, a stem 1231, an inlet face 1223, a second port 1225, and inner surface 1221, and an exterior surface 1211. The fluid cavity 1229 is the space within and through the accelerator 1203. The fluid cavity 1229 decreases in diameter along the axis B toward the stem 1231. The stem 1231 fluidly connects the fluid cavity 1229 to the mixing chamber 1205.

The accelerator 1203 contacts the insert 1201 at the contact interface 1227. In some embodiments the contact interface 1227 is an inference fit between the accelerator 1203 and the insert 1201. The inference fit may include a transition fit which is established by controlling tolerances. A fluid enters the acceleration region 1217 through the one or more first ports 1215. The acceleration region 1217 is defined between the mixing chamber 1205 and the one or more first ports 1215. The fluid leaves the accelerator 1203 and enters mixing chamber 1205 of the insert 1201 to begin atomization. In some embodiments, the accelerator 1203 may have several steps which partially define the acceleration region 1217. In some embodiments, the accelerator 1203 may have straight walls until it narrows toward the stem 1231.

The mixing chamber 1205 is defined by the mixing chamber diameter 1207. The mixing chamber diameter 1207 is less than a diameter of the acceleration region 1217. The mixing chamber diameter 1207 is about 0.4 mm to about 4 mm. The mixing chamber 1205 may also be defined as the region where fluid from the first port 1215 and fluid from the second port 1225 interact. The mixing chamber 1205 is disposed between the first face 1141 and the outlet 1131. The mixing chamber 1205 reduces to the acceleration tube 1209 between the outlet 1131 and the second face 1143. For example, the mixing chamber 1205 reduces to the acceleration tube 1209 in the nozzle portion 1135.

The stem 1231 includes an accelerator port 1237, an outer diameter 1233, and an inner diameter 1235. The accelerator port 1237 is disposed in the mixing chamber 1205. The fluid from the second port 1225 translates through the accelerator 1203 and enters the mixing chamber 1205 from the accelerator port 1237.

The outer diameter 1233 of the stem 1231 is about 0.3 mm to about 3 mm. The inner diameter 1235 of the stem 1231 is about 0.1 mm to about 1 mm. In some embodiments, the outer diameter 1233 is three or more times larger than the inner diameter 1235 of the stem 1231.

In some embodiments, the accelerator port 1237 is disposed on the end of the stem 1231, between the second face 1143 and the outlet 1131. The acceleration tube 1209 and a portion of the mixing chamber 1205 are disposed in the nozzle portion 1135. A distance 1243 between the accelerator port 1237 and the acceleration tube 1209 may correlate to a length 1241 of the acceleration tube 1209. For example, the distance 1243 between the accelerator port 1237 and the acceleration tube 1209 may be greater than the length 1241 of the acceleration tube 1209. By having an acceleration tube 1209 with a length 1241 less than or equal to the distance 1243 between the accelerator port 1237 and the acceleration tube 1209, the distributed fluid will have a larger spray pattern. For example, with a shorter acceleration tube 1209, the distributed atomized fluid will have a larger spray diameter with larger droplet diameters.

For example, the inventors have found when gas is supplied to the first port 1215 at about 22 to about 25 liters per min, the outer diameter 1233 of the stem 1231 is about 1 mm, the mixing chamber diameter 1207 is about 1.4 mm and the diameter of the acceleration tube 1209 is about 1 mm, the nozzle assembly is capable of a homogeneous spray.

In yet another example, the inventors have found when gas is supplied to the first port 1215 at about 55 to about 60 liters per min, the outer diameter 1233 of the stem 1231 is about 1.3 mm, the mixing chamber diameter 1207 is about 1.9 mm and the diameter of the acceleration tube 1209 is about 1.525 mm, the nozzle assembly is capable of a homogeneous spray.

Figure 13:
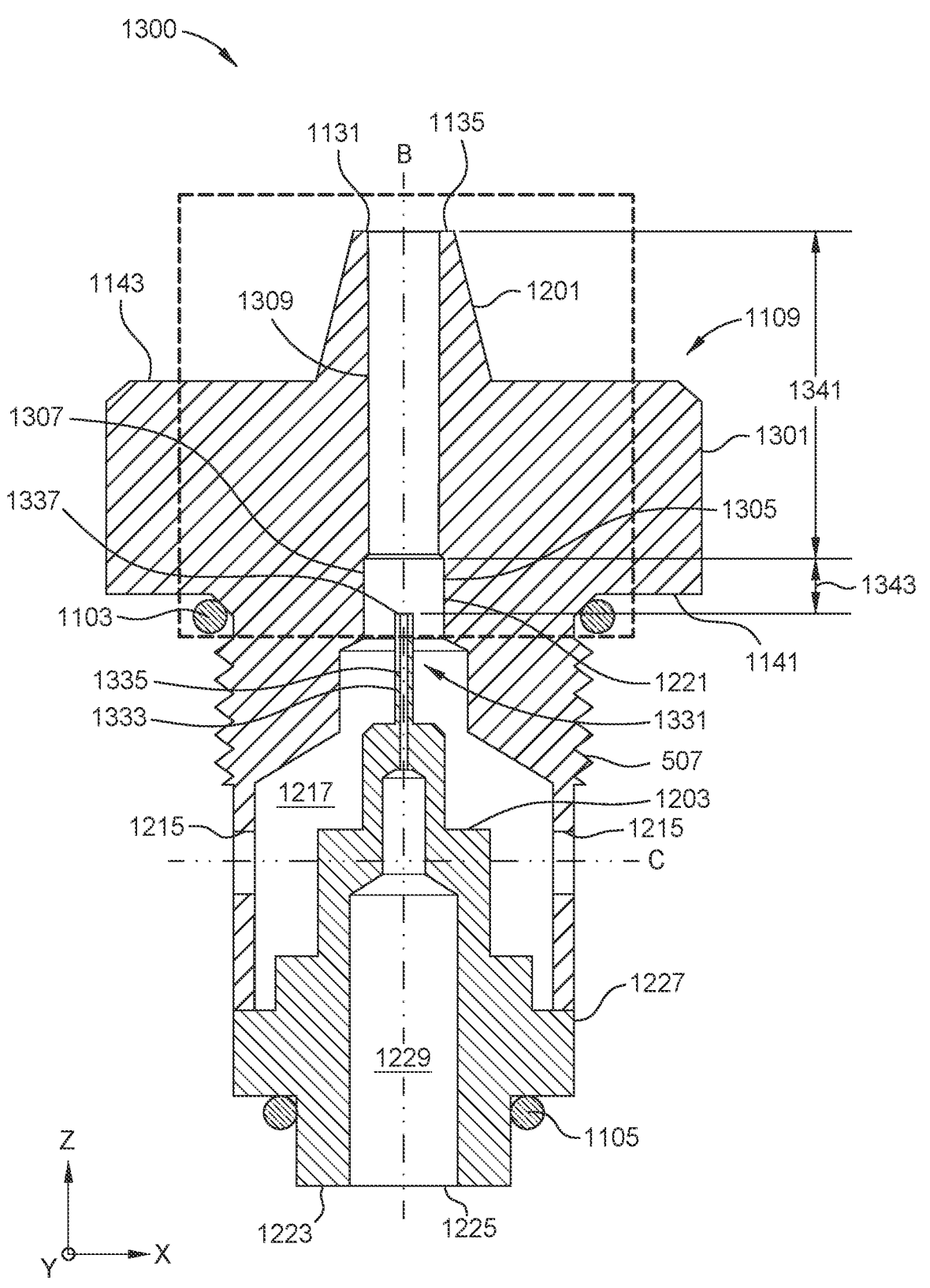
FIG. 13 is a cross-sectional view of part of a nozzle assembly, according to one or more embodiments.

FIG. 13 is a side, cross-sectional view of a nozzle assembly 1300 according to some embodiments. The nozzle assembly 1300 includes an insert 1301, the accelerator 1203, the first seal 1103, the second seal 1105, and central axis B.

The nozzle assembly 1300 can be used in place of the mixing chamber 513 of FIGS. 5-7, the nozzle assembly 1200, and the nozzle assembly 1100.

The insert 1301 is disposed within the internal cavity 401 of the body 301 (FIG. 4). The insert 1301 includes the inner surface 1221 that defines a mixing chamber 1305, an acceleration tube 1309, and the acceleration region 1217.

In some embodiments, the outlet 1131 and the acceleration tube 1309 share a diameter between about 0.1 mm and about 3 mm, for example 1.6 mm. In some embodiments the acceleration tube 1309 has a diameter that varies along a length 1341 of the acceleration tube 1309. In some embodiments, the diameter of outlet 1131 is four or more times the inner diameter 1335 of the stem 1331. The acceleration tube 1309 fluidly connects the outlet 1131 to the mixing chamber 1305.

The mixing chamber 1305 is disposed between the second face 1143 and the one or more first ports 1215. The mixing chamber 1305 is defined by the mixing chamber diameter 1307. The mixing chamber diameter 1307 is less than a diameter of the acceleration region 1217. The mixing chamber diameter 1307 is about 1 mm to about 2 mm, for example about 1.4 mm. The mixing chamber 1305 reduces to the acceleration tube 1309 between the first face 1141 and the second face 1143.

The fluid cavity 1229 of the accelerator 1203 decreases in diameter along the axis B toward the stem 1331. The stem 1331 fluidly connects the fluid cavity 1229 to the mixing chamber 1305.

The acceleration region 1217 is defined between the mixing chamber 1305 and the one or more first ports 1215. The fluid leaves the accelerator 1203 and enters mixing chamber 1305 of the insert 1301 to begin atomization.

The stem 1331 includes an accelerator port 1337 disposed in the mixing chamber 1305. The fluid from the second port 1225 translates through the accelerator 1203 and enters the mixing chamber 1305 from the accelerator port 1337.

The stem 1331 also includes an outer diameter 1333 and an inner diameter 1335. In some embodiments, the outer diameter 1333 is three or more times larger than the inner diameter 1335 of the stem 1331. In some embodiments, the diameter of outlet 1131 is four or more times the inner diameter 1335 of the stem 1331.

In some embodiments, the accelerator port 1337 is disposed between the first face 1141 and bottom face 529 of the body 301 (FIG. 11). The acceleration tube 1309 is disposed in the nozzle portion 1135 and cap portion 1109 of the insert 1301. For example, the acceleration tube 1309 is disposed between the first face 1141 and the outlet 1131. A distance 1343 between the accelerator port 1337 and the acceleration tube 1309 may correlate to a length 1341 of the acceleration tube 1309. For example, the distance 1343 between the accelerator port 1337 and the acceleration tube 1309 may be greater than the length 1341 of the acceleration tube 1309. By having an acceleration tube 1309 with a length 1341 greater than the distance 1343 between the accelerator port 1337 and the acceleration tube 1309, the distributed fluid will have increased interaction between the fluid from the first port 1215 and the second port 1225. For example, if the fluid from the first port 1215 is a gas and the fluid from the second port 1225 is a liquid, the gas-liquid interaction thereby creates more uniform droplet size and smaller droplet diameter distribution from fluid leaving the outlet 1131. In yet another example, if the fluid from the first port 1215 is a liquid and the fluid from the second port 1225 is a gas, the gas-liquid interaction thereby creates more uniform droplet size and smaller droplet diameter distribution from fluid leaving the outlet 1131.

The embodiments described above allow for a reduction of liquid used in a cleaning process. The space within the mixing chamber 1305 from the accelerator port 1337 to the acceleration tube 1309 creates an atomization pocket when a liquid enters the nozzle assembly 1300 through the second port 1225 and a gas enters the nozzle assembly 1300 through the first port 1215. The gas must pass around the outer diameter 1333 of the stem 1331. The cross sectional area of the path of fluid from the first port 1215 is the area formed by the diameter mixing chamber 1305 minus the outer diameter 1333 of the stem 1331 when it enters the mixing chamber 1305. The cross sectional area of the path of fluid from the first port 1215 is equal to or smaller than cross sectional area formed by the inner diameter 1335 of the stem 1331.

The mixing chamber diameter 1307 is less than the diameter of the acceleration region 1217. Thus the velocity of the fluid from the first port 1215 is at least equal to or greater than the fluid translating through the acceleration tube 1309. The increase in velocity of the fluid from the first port 1215 creates a flow separation region in the mixing chamber 1305 downstream of the accelerator port 1337 having lower pressure. The lower pressure in the mixing chamber 1305 enables a lower backpressure for fluid from the second port 1225. For example, when fluid from the first port 1215 is a gas and fluid from the second port 1225 is a liquid, the expansion of the gas enhances the atomization of the liquid in the mixing chamber 1305.

Figures 14, 15:
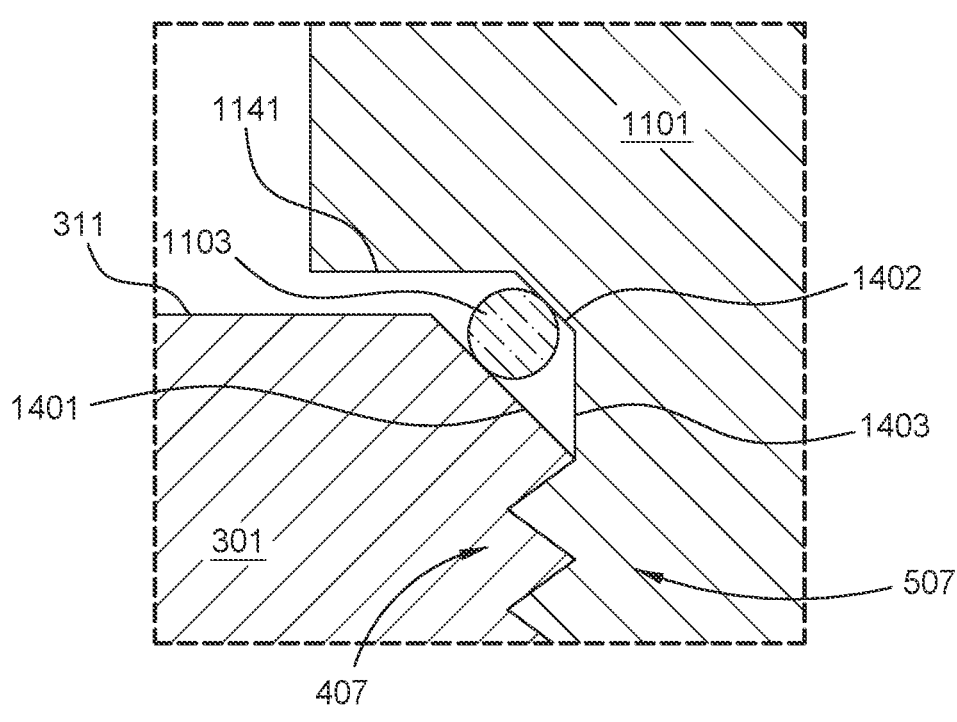
FIG. 14 is a cross-sectional view of part of a nozzle assembly, according to one or more embodiments.
FIG. 15 is a cross-sectional view of an acceleration tube, according to one or more embodiments.

FIG. 14 is a cross-sectional view of part of a nozzle assembly, according to one or more embodiments. The nozzle assembly may be the nozzle assembly 1100, the nozzle assembly 1200, and/or the nozzle assembly 1300, but other the nozzle assemblies are contemplated.

The insert 1101 includes the first face 1141, a shoulder 1402, the threaded region 507, and a vertical face 1403. The body 301 includes the spray face 311, a threaded region 407, and a shoulder 1401.

The vertical face 1403 is disposed between the threaded region 507 and the first face 1141. The shoulder 1402 of the insert 1101 is a chamfered face. The shoulder 1401 of the body 301 is a chamfered face that is about parallel to the shoulder 1402 of the insert 1101. Either one of or both of the insert shoulder 1402 and the body shoulder 1401 are configured to provide an axial force and radial force to the seal 1103 as the insert 1101 is threaded into the body 301. The radial force is about parallel with the first face 1141 and the axial force is about parallel with the vertical face 1403. The combination of axial and radial forces enhances the alignment of the insert 1101 within the body 301. The above described configuration of shoulders 1401, 1402 may be applied to the second seal 1105 (FIG. 11) so that the nozzle assemblies 1100, 1200, 1300 are aligned with the second inlet 521. The above described configuration of shoulders 1401, 1402 may also be applied to a supply (not shown) to the first inlet 307 and to a supply (not shown) to the second inlet 521.

FIG. 15 is a cross-sectional view of the acceleration tube 1309, according to one or more embodiments. In some embodiments that may be combined with other embodiments, the acceleration tube 1309 includes a first expansion chamber 1501, a second expansion chamber 1502, a third expansion chamber 1503, a fourth expansion chamber 1504, and a fifth expansion chamber 1505. The first expansion chamber 1501 is disposed adjacent the mixing chamber 1305. The first expansion chamber 1501 has a diameter less than the mixing chamber 1205. The first expansion chamber 1501 separates the mixing chamber 1205 and the second expansion chamber 1502.

The second expansion chamber 1502 has a diameter greater than the diameter of the first expansion chamber 1501. The order of the expansion chambers 1501, 1502, 1503, 1504, 1505 from the mixing chamber 1205 to the outlet 1131 is the first expansion chamber 1501, then the second expansion chamber 1502, then the third expansion chamber 1503, then the fourth expansion chamber 1504, and then the fifth expansion chamber 1505. The fifth expansion chamber 1505 has a diameter equal to the diameter of the outlet 1131. In some embodiments, the diameters of the expansion chambers 1501, 1502, 1503, 1504, 1505 increase such that the diameter of each expansion chamber is larger than the prior expansion chamber. In some embodiments, the diameter of the fifth expansion chamber 1505 is greater than the diameter of the mixing chamber. The expansion chambers 1501, 1502, 1503, 1504, 1505 are disposed concentric with each other.

The progressive increase in diameter and/or size of the expansion chambers 1501, 1502, 1503, 1504, 1505 enhances the acceleration tubes capability to homogenize liquid and gas phases of the process fluid before it leaves the outlet 1131.

The above described nozzle assemblies aid in creating a homogeneous atomized mixture for spraying in semiconductor manufacturing. The embodiments disclosed minimize the range of sprayed droplet size by providing enhanced sealing capabilities to avoid premature fluid contamination, and by ensuring mixture uniformity prior to leaving the nozzle assembly. The pressurized gas and liquid mixture experiences at least two aspects when released from the outlet of the nozzle assemblies. The incompressible liquid in the mixture starts to form droplets due to adhesive force and surface tension. The gas on the other hand undergoes sudden expansion since the compressed gas is released to atmospheric pressure. First, the availability of liquid in the expanding two-phase medium determines the droplet size. Second, the pressure generated in the mixing chamber of the nozzle assemblies determines the mixture expansion rate and mixture velocity at which the droplets and gas leave the outlet. The embodiments described help to reduce the range of droplet size along a size distribution spectrum. The embodiments described can be optimized to generate a specific velocity and droplet size and can help determine the kinetic energy of the sprayed mixture. Depending on process requirements a tangential swirl effect or an axial acceleration effect may be ideal for the application.

The above examples are not limiting in scope and are provided to further illustrate possible applications and embodiments.

While the foregoing is directed to embodiments of the present disclosure, other and further embodiments of the disclosure may be devised without departing from the basic scope thereof, and the scope thereof is determined by the claims that follow.

What is claimed is:

1. A nozzle assembly for semiconductor manufacturing, comprising:

a body comprising:

an internal surface that defines an internal cavity disposed within the body;

a first inlet disposed within the body, the first inlet in fluid communication with the internal cavity;

a second inlet disposed within the body, the second inlet in fluid communication with the internal cavity;

an insert partially disposed within the internal cavity, the insert being a monolithic body, the insert comprising:

a mixing chamber comprising:

a first port fluidly connecting the first inlet of the body to the mixing chamber, the first port disposed through a sidewall of the insert; and a second port fluidly connecting the second inlet of the body to the mixing chamber; and an outlet in fluid communication with the mixing chamber that is positioned outside of the body.

2. The nozzle assembly of claim 1 wherein the second port is parallel to the outlet of the insert.

3. The nozzle assembly of claim 1, wherein the first port comprises a cross section that is two or more times greater than a cross section of the second port.

4. The nozzle assembly of claim 1, further comprising an accelerator disposed within the insert and opposite the outlet, the accelerator comprising:

an accelerator port disposed on an end of a stem.

5. The nozzle assembly of claim 4, wherein a stem of the accelerator extends into the mixing chamber.

6. The nozzle assembly of claim 1, wherein the insert further comprises an outlet, the outlet formed by an acceleration tube, the acceleration tube disposed between the outlet and the mixing chamber.

7. The nozzle assembly of claim 6, wherein the acceleration tube comprises:

a first expansion chamber; and a second expansion chamber concentric with the first expansion chamber, the second expansion chamber disposed between the first expansion chamber and the outlet, a diameter of the second expansion chamber being greater than a diameter of the first expansion chamber.

8. The nozzle assembly of claim 1, further comprising a seal disposed between the body and the insert, the body comprising a shoulder having a chamfered face disposed between the internal surface and an exterior face of the body.

9. The nozzle assembly of claim 8, wherein the shoulder is configured to provide an axial force and radial force.

10. A nozzle assembly for semiconductor manufacturing, comprising:

a body comprising:

an internal surface that defines an internal cavity disposed within the body;

a first inlet disposed within the body, the first inlet in fluid communication with the internal cavity;

a first shoulder disposed between the internal surface and an exterior face of the body;

a second inlet disposed within the body, the second inlet in fluid communication with the internal cavity;

an insert partially disposed within the internal cavity, the insert being a monolithic body, the insert comprising:

a mixing chamber formed within the insert, the mixing chamber having a longitudinal chamber axis and comprising:

a first port fluidly connecting the first inlet of the body to the mixing chamber, the first port tangentially aligned with an interior chamber surface of the mixing chamber relative to a cross-section taken radially across the longitudinal chamber axis; and a second port fluidly connecting the second inlet of the body to the mixing chamber;

an outlet in fluid communication with the mixing chamber; and a seal disposed in contact with a second shoulder of the body, the second shoulder disposed between the mixing chamber and the second inlet, the second shoulder configured to apply radial and axial force to the seal.

11. The nozzle assembly of claim 10, wherein the outlet is disposed outside of the body.

12. The nozzle assembly of claim 10, further comprising a seal disposed between the body and the insert, the body comprising the first shoulder having a chamfered face disposed between the internal surface and the exterior face of the body.

13. The nozzle assembly of claim 12, wherein the first shoulder is configured to provide an axial force and radial force as the insert is threaded into the body.

14. The nozzle assembly of claim 10, further comprising a seal disposed within the internal cavity of the body and between the second shoulder and the insert, the second shoulder having a chamfered face disposed between the internal surface and the second inlet.

15. A nozzle assembly for semiconductor manufacturing, comprising:

a body comprising:

an internal surface that defines an internal cavity disposed within the body;

a first inlet disposed within the body, the first inlet in fluid communication with the internal cavity;

a first shoulder disposed between the internal surface and an exterior face of the body;

a second inlet disposed within the body, the second inlet in fluid communication with the internal cavity;

an insert partially disposed within the internal cavity, the insert being a monolithic body, the insert comprising:

a mixing chamber comprising:

a first port fluidly connecting the first inlet of the body to the mixing chamber, the first port perpendicular to an axis of the mixing chamber; and an outlet in fluid communication with the mixing chamber, the outlet defining an acceleration tube;

an accelerator disposed within the insert and opposite the outlet, the first port disposed between the outlet and the accelerator, the accelerator comprising:

a stem extending into the mixing chamber;

a second port fluidly connecting the second inlet of the body to the mixing chamber, the second port disposed opposite the stem;

a fluid cavity extending from the second port to the stem, wherein the fluid cavity decreases in diameter extending toward the stem; and an accelerator port disposed opposite the second port.

16. The nozzle assembly of claim 15, wherein the stem comprises an outer diameter three or more times larger than an inner diameter of the stem.

17. The nozzle assembly of claim 15, wherein the outlet comprises a diameter of four or more times an inner diameter of the stem.

18. The nozzle assembly of claim 15, wherein the acceleration tube fluidly couples the mixing chamber to the outlet.

19. The nozzle assembly of claim 15, wherein a diameter of the acceleration tube increases along a length of the acceleration tube.

20. The nozzle assembly of claim 15, wherein a distance between the accelerator port and the acceleration tube is less than half a length of the acceleration tube.

\* \* \* \* \*